United States Patent
Suzuki et al.

(10) Patent No.: US 12,501,675 B2
(45) Date of Patent: Dec. 16, 2025

(54) SEMICONDUCTOR DEVICE

(71) Applicant: Mitsubishi Electric Corporation, Tokyo (JP)

(72) Inventors: Kenji Suzuki, Tokyo (JP); Yuki Haraguchi, Tokyo (JP); Haruhiko Minamitake, Tokyo (JP); Taiki Hoshi, Tokyo (JP); Hidenori Koketsu, Tokyo (JP); Yusuke Miyata, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 434 days.

(21) Appl. No.: 18/307,456

(22) Filed: Apr. 26, 2023

(65) Prior Publication Data
US 2023/0420524 A1  Dec. 28, 2023

(30) Foreign Application Priority Data
Jun. 27, 2022 (JP) .................. 2022-102399

(51) Int. Cl.
*H10D 62/60* (2025.01)
*H10D 12/00* (2025.01)
*H10D 62/53* (2025.01)

(52) U.S. Cl.
CPC ........... *H10D 62/60* (2025.01); *H10D 12/481* (2025.01); *H10D 62/53* (2025.01)

(58) Field of Classification Search
CPC ...... H10D 62/60; H10D 12/481; H10D 62/53; H10D 12/038; H10D 12/01; H10D 62/102; H10D 12/411; H01L 21/263
See application file for complete search history.

(56) References Cited

U.S. PATENT DOCUMENTS

| | | | |
|---|---|---|---|
| 6,482,681 B1 | 11/2002 | Francis et al. | |
| 2002/0190281 A1* | 12/2002 | Francis | H10D 62/53 257/E29.066 |
| 2014/0299915 A1 | 10/2014 | Kouno et al. | |
| 2015/0371858 A1 | 12/2015 | Laven et al. | |
| 2021/0098252 A1* | 4/2021 | Onozawa | H10D 12/032 |
| 2023/0041042 A1* | 2/2023 | Yaguchi | H10D 8/422 |

FOREIGN PATENT DOCUMENTS

| | | |
|---|---|---|
| JP | 2003-533047 A | 11/2003 |
| JP | 2013-138172 A | 7/2013 |
| JP | 2016-009868 A | 1/2016 |
| WO | 2001/086712 A1 | 11/2001 |

* cited by examiner

*Primary Examiner* — Syed I Gheyas
(74) *Attorney, Agent, or Firm* — Studebaker Brackett PLLC

(57) ABSTRACT

A first buffer layer includes: a first region containing protons and in contact with a drift layer; a second region between the first region and a first principal surface containing protons, and in contact with the first region; and a third region between the second region of the first buffer layer and the first principal surface. An impurity concentration profile of the first buffer layer includes: a maximum value in the second region; a kink at a boundary point between the first region and the second region, relaxing or stopping a decrease from the maximum value; a value at the boundary point higher than or equal to 80% of the maximum value; and a distribution of the third region longer than or equal to 5 μm and having an impurity concentration lower than the value at the boundary point and lower than or equal to $5.0\times10^{14}/cm^3$.

10 Claims, 24 Drawing Sheets

F I G. 6
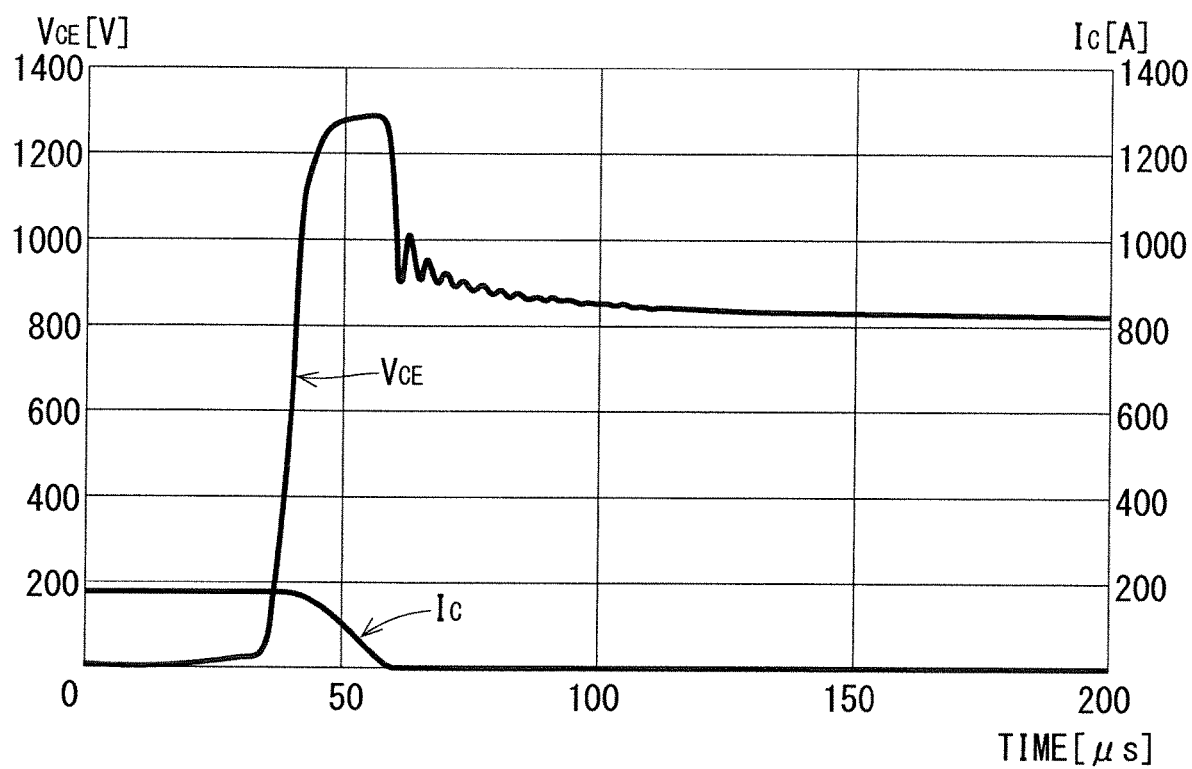

SEMICONDUCTOR DEVICE

BACKGROUND OF THE INVENTION

Field of the Invention

The present disclosure relates to a semiconductor device, and particularly to a semiconductor device containing protons as an impurity.

Description of the Background Art

For example, vertical semiconductor devices such as insulated gate bipolar transistors (IGBTs) switch from conduction states to non-conduction states, that is, perform turn-off operations by extending a depletion layer and stop the extending at a predetermined depth. The turn-off operations may generate surge voltages. These surge voltages may cause oscillation phenomena. A technology using proton implantation into silicon (Si) wafers has been proposed as a technology for obtaining impurity concentration profiles intended to suppress the surge voltages or the oscillation phenomena. It is widely known that proton implantation into silicon and a subsequent heat treatment generate donors contributing to n-type conductivity.

Japanese Patent Application Laid-Open No. 2016-009868 argues that a variation in a vertical doping profile of a drift layer is beneficial in terms of suppressing switching oscillations. Thus, radiation-induced donors are used. Specifically, irradiating a wafer with high-energy particles, e.g., protons and a subsequent heat treatment generate donors corresponding to a damage concentration profile of implantation.

Japanese Patent Application Laid-Open No. 2013-138172 discloses a vertical semiconductor element including: an n-type drift layer; an n-type or p-type semiconductor region formed on a back side of the drift layer; an n-type field stop layer formed from a back surface of a semiconductor substrate to a depth greater than that of the semiconductor region and having an impurity concentration higher than that of the drift layer; a p-type region formed on a front side of the drift layer; an upper electrode formed on the front side of the drift layer and being in contact with the p-type region; and a lower electrode formed on the back side of the drift layer and being in contact with the semiconductor region. The field stop layer includes a phosphorus/arsenic layer doped with phosphorus or arsenic, and a proton layer doped with protons. The phosphorus/arsenic layer is formed from the back surface of the semiconductor substrate to a predetermined depth. An impurity concentration of the proton layer peaks inside the phosphorus/arsenic layer. The proton layer is deeper than the phosphorus/arsenic layer. The proton layer has an impurity concentration profile in which the impurity concentration gradually decreases at a depth greater than that of the phosphorus/arsenic layer.

As argued in the latter application that the field stop layer includes the phosphorus/arsenic layer and the proton layer and the impurity concentration of the proton layer gradually decreases, first, the impurity concentration of the proton layer can be decreased, compared with a field stop layer made with only protons. Consequently, the productivity can be improved and an increase in the product cost can be reduced, compared with the field stop layer made by simply implanting protons. Second, the proton layer has an impurity concentration distribution in which the n-type impurity concentration continuously gradually decreases at a depth greater than that of the phosphorus/arsenic layer. Thus, a difference in n-type impurity concentration at a boundary position between the proton layer and the drift layer becomes small. Consequently, it is possible to relax an electric field concentration, ensure a breakdown voltage, and reduce a switching surge.

According to the technology in the latter application, it is argued that a mild difference in n-type impurity concentration at the boundary position between the proton layer and the drift layer can reduce the switching surge. Under this technology, however, the impurity concentration of the proton layer peaks at a portion inside the phosphorus/arsenic layer, and the impurity concentration gradually decreases from the portion toward the drift layer. Thus, this technology does not intend to provide a structure in which a concentration of protons peaks at a greater depth from a substrate. Considerations of the present inventors conclude that such a structure hardly fully suppresses oscillations.

SUMMARY

The present disclosure has been conceived to solve such a problem, and has an object of providing a semiconductor device in which oscillations at turn-off can be effectively suppressed.

A semiconductor device according to one aspect of the present disclosure includes: a first electrode layer; a second electrode layer apart from the first electrode layer in a thickness direction; and a semiconductor substrate including a first principal surface in contact with the first electrode layer, and a second principal surface in contact with the second electrode layer and opposite to the first principal surface in the thickness direction. The semiconductor substrate includes: a drift layer of n-type; and a first buffer layer of n-type between the first principal surface and the drift layer. The first buffer layer includes: a first region containing protons, being higher in impurity concentration than the drift layer, and being in contact with the drift layer; a second region containing protons, being higher in impurity concentration than the drift layer, being disposed between the first region and the first principal surface, and being in contact with the first region; and a third region between the second region of the first buffer layer and the first principal surface of the semiconductor substrate. The first buffer layer has an impurity concentration profile depending on a depth distance from the first principal surface along the thickness direction. The impurity concentration profile includes: a maximum value in the second region as a maximum value of the impurity concentration profile of the first buffer layer; a kink at a boundary point between the first region and the second region, the kink relaxing or stopping a decrease from the maximum value; a value at the boundary point, the value being higher than or equal to 80% of the maximum value; and a distribution of the third region, the distribution being longer than or equal to 5 µm and having an impurity concentration lower than the value at the boundary point and lower than or equal to $5.0 \times 10^{14}/cm^3$.

In the semiconductor device according to the one aspect of the present disclosure, oscillations at turn-off can be effectively suppressed.

These and other objects, features, aspects, and advantages of the present disclosure will become more apparent from the following detailed description of the present disclosure when taken in conjunction with the accompanying drawings.

BRIEF DESCRIPTION OF THE DRAWINGS

FIG. 6 is a graph illustrating example turn-off waveforms obtained from a simulation on the semiconductor device of the comparative example;

DESCRIPTION OF THE PREFERRED EMBODIMENTS

Figure 1:
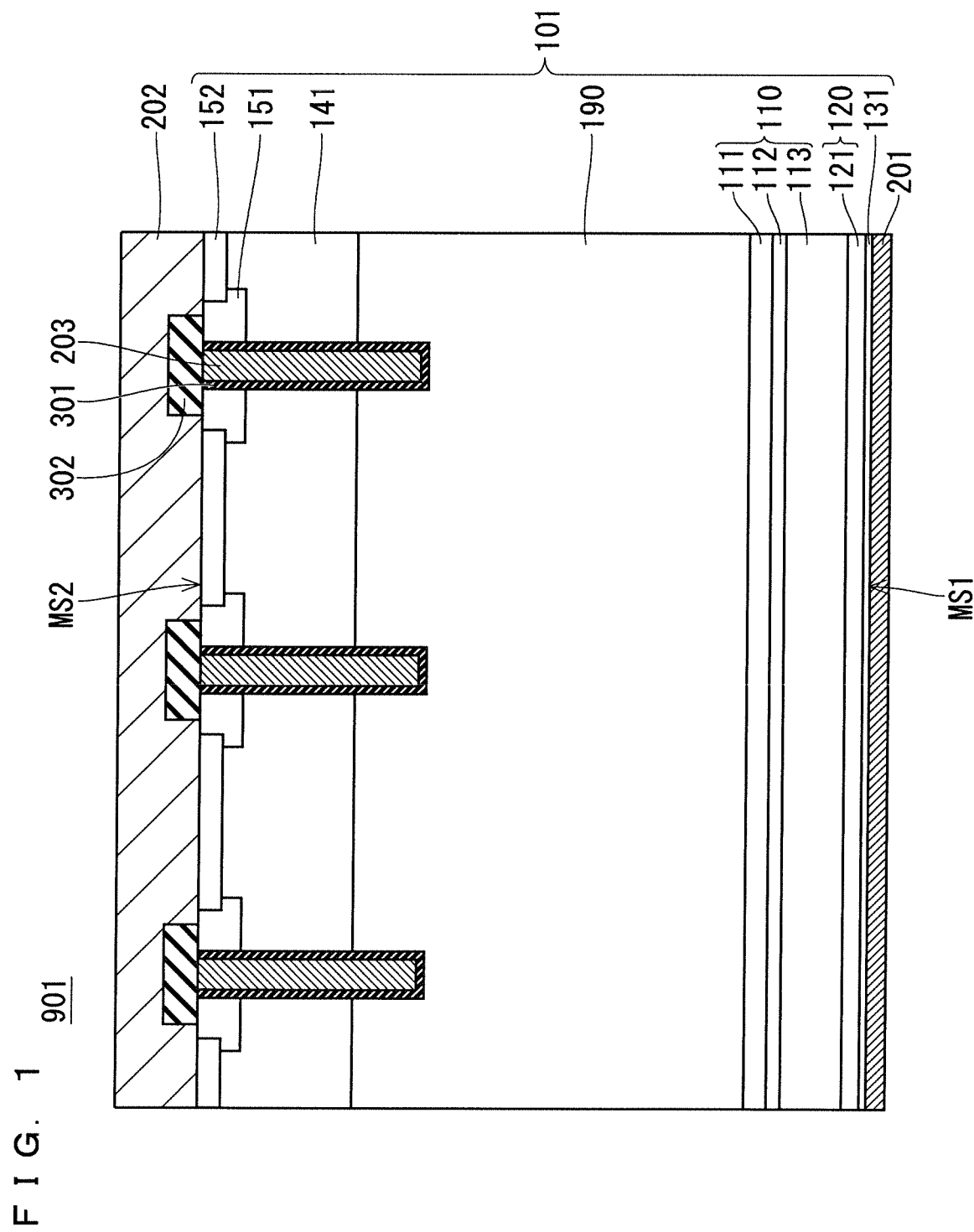
FIG. 1 is a cross-sectional view schematically illustrating a structure of a semiconductor device according to Embodiment 1.

Embodiments will be described with reference to drawings. The same reference numerals are assigned to the same or equivalent portions in the drawings, and the description is not repeated. Unless otherwise noted, an impurity concentration of a semiconductor substrate means an effective impurity concentration in the Description. The effective impurity concentration in an n-type region is a concentration obtained by subtracting an effective concentration of acceptors from an effective concentration of donors. The effective impurity concentration in a p-type region is a concentration obtained by subtracting the effective concentration of donors from the effective concentration of acceptors. The effective concentration of non-proton impurities (impurities other than protons) is a concentration of activated impurities. The effective concentration of protons is a concentration of donors generated from protons.

Embodiment 1

Figure 2:
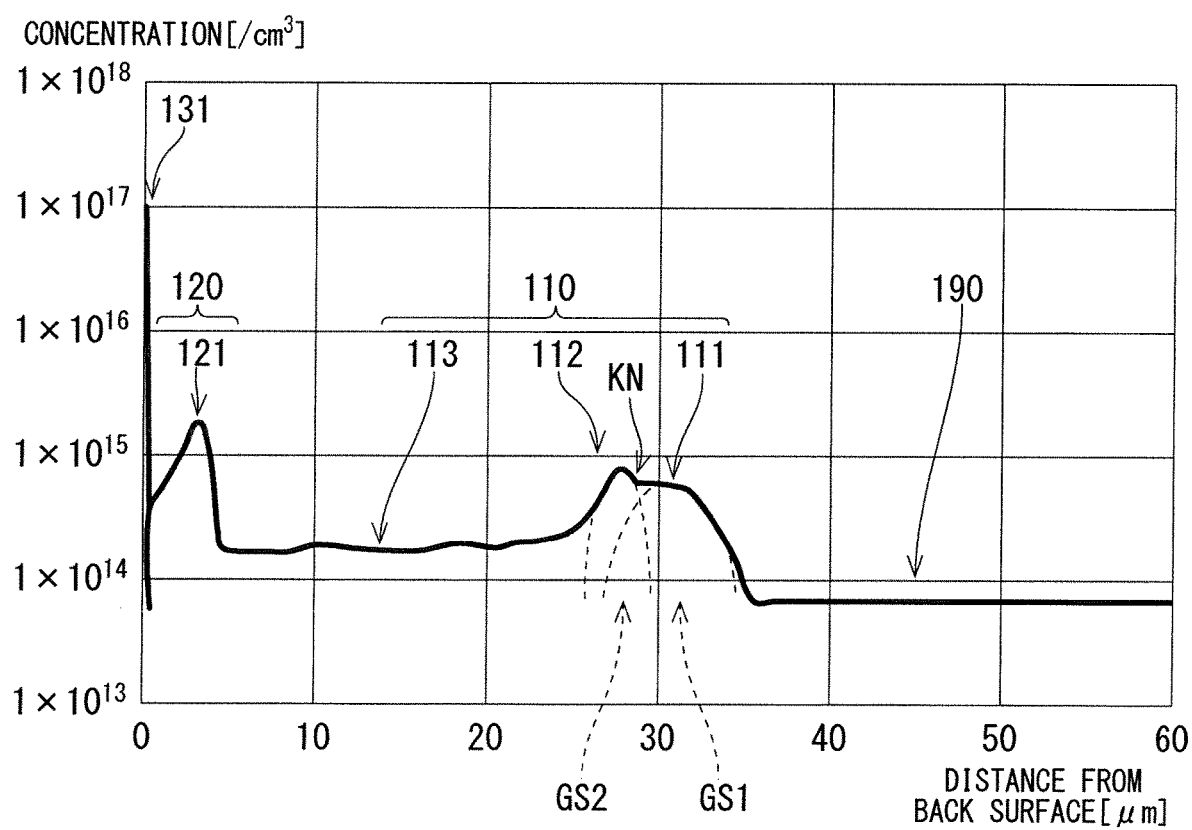
FIG. 2 is a graph illustrating an example impurity concentration profile near a back surface of a semiconductor substrate in FIG. 1.

FIG. 1 is a cross-sectional view schematically illustrating a structure of an IGBT 901 (a semiconductor device) according to Embodiment 1. FIG. 2 is a graph illustrating an example impurity concentration profile near a back surface MS1 (a first principal surface) of a wafer 101 (a semiconductor substrate) in FIG. 1.

The IGBT 901 includes the wafer 101 (semiconductor substrate) including: a collector electrode layer 201 (a first electrode layer); an emitter electrode layer 202 (a second electrode layer) apart from the collector electrode layer 201 in a thickness direction (a vertical direction in FIG. 1); the back surface MS1 (first principal surface) in contact with the collector electrode layer 201; and a top surface MS2 (second principal surface) in contact with the emitter electrode layer 202 and opposite to the back surface MS1 in the thickness direction. Furthermore, the IGBT 901 has a gate structure, and specifically includes gate electrodes 203, gate oxide films 301 (gate insulating films), and an interlayer insulation film 302.

The wafer 101 may be a silicon wafer. The wafer 101 includes a drift layer 190 of n-type, and a first buffer layer 110 of n-type. Furthermore, the wafer 101 includes a second buffer layer 120 of n-type, according to Embodiment 1.

Furthermore, the wafer 101 includes a p-base layer 141 of p-type, an $n^+$ emitter layer 151 of n-type higher in impurity concentration than the drift layer 190, a $p^+$ contact layer 152 of p-type higher in impurity concentration than the p-base layer 141, and a collector layer 131 of p-type, which are necessary when the semiconductor device is an IGBT. The collector layer 131 is disposed at the back surface MS1, and has functions of a carrier injection layer. To sum up, the collector layer 131, the second buffer layer 120, the first buffer layer 110, the drift layer 190, and the p-base layer 141 are laminated in order from the back surface MS1 toward the top surface MS2. Furthermore, the n+ emitter layer 151 and the p+ contact layer 152 are disposed at the top surface MS2.

The gate electrodes 203 face the p-base layer 141 through the gate oxide films 301 between the n+ emitter layer 151 and the drift layer 190. The IGBT 901 illustrated in FIG. 1 has a trench-type gate structure; thus, the wafer 101 has trenches reaching the drift layer 190 from the top surface MS2. The gate electrode 203 is embedded in each of the trenches through the gate oxide film 301. The emitter electrode layer 202 is disposed on the top surface MS2, and is in contact with the n+ emitter layer 151 and the p+ contact layer 152. The interlayer insulating film 302 provides insulation between the emitter electrode layer 202 and the gate electrodes 203. The impurity concentration of the p-base layer 141 may be determined by a threshold voltage of switching to be performed in a gate structure. For example, when the threshold voltage is approximately 6 V, a peak value of the impurity concentration may be higher than or equal to $8 \times 10^{16}/cm^3$ and lower than or equal to $5 \times 10^{17}/cm^3$.

The first buffer layer 110 is disposed between the back surface MS1 and the drift layer 190. The first buffer layer 110 includes a first region 111, a second region 112, and a third region 113 in order in a direction from the top surface MS2 toward the back surface MS1. The first region 111 is in contact with the drift layer 190. The first region 111 contains protons for generating donors, and is higher in impurity concentration than the drift layer 190. The impurity concentration of the first region 111 may be lower than or equal to $1 \times 10^{15}/cm^3$. The second region 112 is disposed between the first region 111 and the back surface MS1, and is in contact with the first region 111. The second region 112 contains protons for generating donors, and is higher in impurity concentration than the drift layer 190. The third region 113 is disposed between the second region 112 and the back surface MS1 of the wafer 101. The third region 113 may contain protons for generating donors, and may be higher in impurity concentration than the drift layer 190.

The first buffer layer 110 has an impurity concentration profile (FIG. 2) depending on a depth distance from the back surface MS1 along the thickness direction. The impurity concentration profile of the first buffer layer 110 has the following characteristics.

First, the impurity concentration profile of the first buffer layer 110 has a maximum value in the second region 112 as the maximum value of the impurity concentration profile of the first buffer layer 110. In other words, the position of the maximum value of the impurity concentration profile of the first buffer layer 110 is located in the second region 112. The distance from the back surface MS1 to this position may be longer than or equal to 10 and is longer than or equal to 20 μm in the example in FIG. 2.

Second, the impurity concentration profile of the first buffer layer 110 has a kink at a boundary point KN between the first region 111 and the second region 112 where a decrease from the maximum value is relaxed or stopped. In other words, the kink at the boundary point KN between the first region 111 and the second region 112 relaxes or stops the decrease from the maximum value. In the example in FIG. 2, as the distance from the back surface indicated in the horizontal axis of the graph increases, the impurity concentration decreases from the maximum value, and the decrease is almost stopped at the boundary point KN, and the impurity concentration decreases again. The decrease from the maximum value of the impurity concentration need not always be stopped at the boundary point KN, but should be at least relaxed. The decrease need not be changed into an increase at the boundary point KN.

Here, assume a function f satisfying N=f(Z) in the graph illustrated in FIG. 2, where N denotes an impurity concentration indicated in the vertical axis, and Z denotes a distance from the back surface indicated in the horizontal axis. Furthermore, $Z_{MAX}$ denotes the position of the maximum value in the horizontal axis, $Z_{KN}$ denotes Z corresponding to the boundary point KN, and $Z_{drft}$ denotes a position at which the drift layer 190 reaches the first region 111. Under these definitions, $Z_{MAX} < Z_{KN} < Z_{drft}$ is satisfied. When $Z=Z_{KN}$, a second derivative $d^2N/dZ^2$ may have a positive local maximum value.

Third, the impurity concentration profile of the first buffer layer 110 has a value of higher than or equal to 80% of the maximum value at the boundary point KN. In other words, the value at the boundary point KN in the impurity concentration profile of the first buffer layer 110 is higher than or equal to 80% of the maximum value. With this, the kink at the boundary point KN fully produces an increase in a width at half maximum of the first buffer layer 110. The value at the boundary point KN in the impurity concentration profile of the first buffer layer 110 may be lower than or equal to $1 \times 10^{15}/cm^3$.

Fourth, the impurity concentration profile of the first buffer layer 110 has, as a distribution of the third region 113, a distribution of a region longer than or equal to 5 μm and having an impurity concentration lower than the value at the boundary point KN and lower than or equal to $5.0 \times 10^{14}/cm^3$.

The impurity concentrations of the first region 111 and the second region 112 can be approximated by a sum of a Gaussian distribution GS1 and a Gaussian distribution GS2. A peak position of the Gaussian distribution GS2 almost matches the position of the maximum value of the second region 112. A peak position of the Gaussian distribution GS1 is located between the peak position of the Gaussian distribution GS2 and the drift layer 190. The peak value of the Gaussian distribution GS1 is smaller than that of the Gaussian distribution GS2. An intersection between the Gaussian distribution GS1 and the Gaussian distribution GS2 in the horizontal axis of the graph in FIG. 2 almost matches the boundary point KN. A value of an impurity concentration at this intersection may be higher than or equal to 80% of the peak value of the Gaussian distribution GS2.

The distribution of the third region 113 in the impurity concentration profile may be maintained within 20% of a representative value, which means that the impurity concentration profile of the third region 113 is almost flat. The representative value may be a value near the center of the third region 113, for example, a value at an intermediate position between the position of the maximum value of the impurity concentration in the second region 112 and a peak position of an impurity concentration in a fourth region 121 to be described later. When the fourth region 121 is omitted, a peak position of the collector layer 131 may be referred to instead of the peak position of the impurity concentration in the fourth region 121.

The back surface MS1 of the wafer 101 has a first concentration of oxygen, and the top surface MS2 of the wafer 101 has a second concentration of oxygen. The first concentration of oxygen may be higher than the second concentration of oxygen. The first concentration of oxygen may be higher than or equal to $4.5 \times 10^{17}/cm^3$. The second concentration of oxygen may be lower than or equal to $1.8 \times 10^{17}/cm^3$. The first concentration of oxygen may be lower than or equal to $2.0 \times 10^{18}/cm^3$. The second concentration of oxygen may be higher than or equal to $1.0 \times 10^{16}/cm^3$.

The second buffer layer 120 is disposed between the back surface MS1 and the first buffer layer 110. The second buffer layer 120 is higher in impurity concentration than the third region 113 of the first buffer layer 110. The second buffer layer 120 has the fourth region 121 in Embodiment 1. The fourth region 121 contains protons for generating donors. The impurity concentration profile of the fourth region 121 may have a local maximum value in the thickness direction. At the position of this local maximum value, the fourth region 121 contains protons with an effective concentration higher than that of non-proton impurities. In other words, donors of the fourth region 121 are mainly generated from protons.

The IGBT 901 is for high voltage use and, for example, an IGBT belonging to a 1200 V breakdown-voltage class. Here, the specific electrical resistance of the drift layer 190 may range from 50 Ω·cm to 67 Ω·cm. Furthermore, a total thickness of the drift layer 190, the first buffer layer 110, and the second buffer layer 120 may range, for example, from 100 μm to 130 μm.

Figure 3:
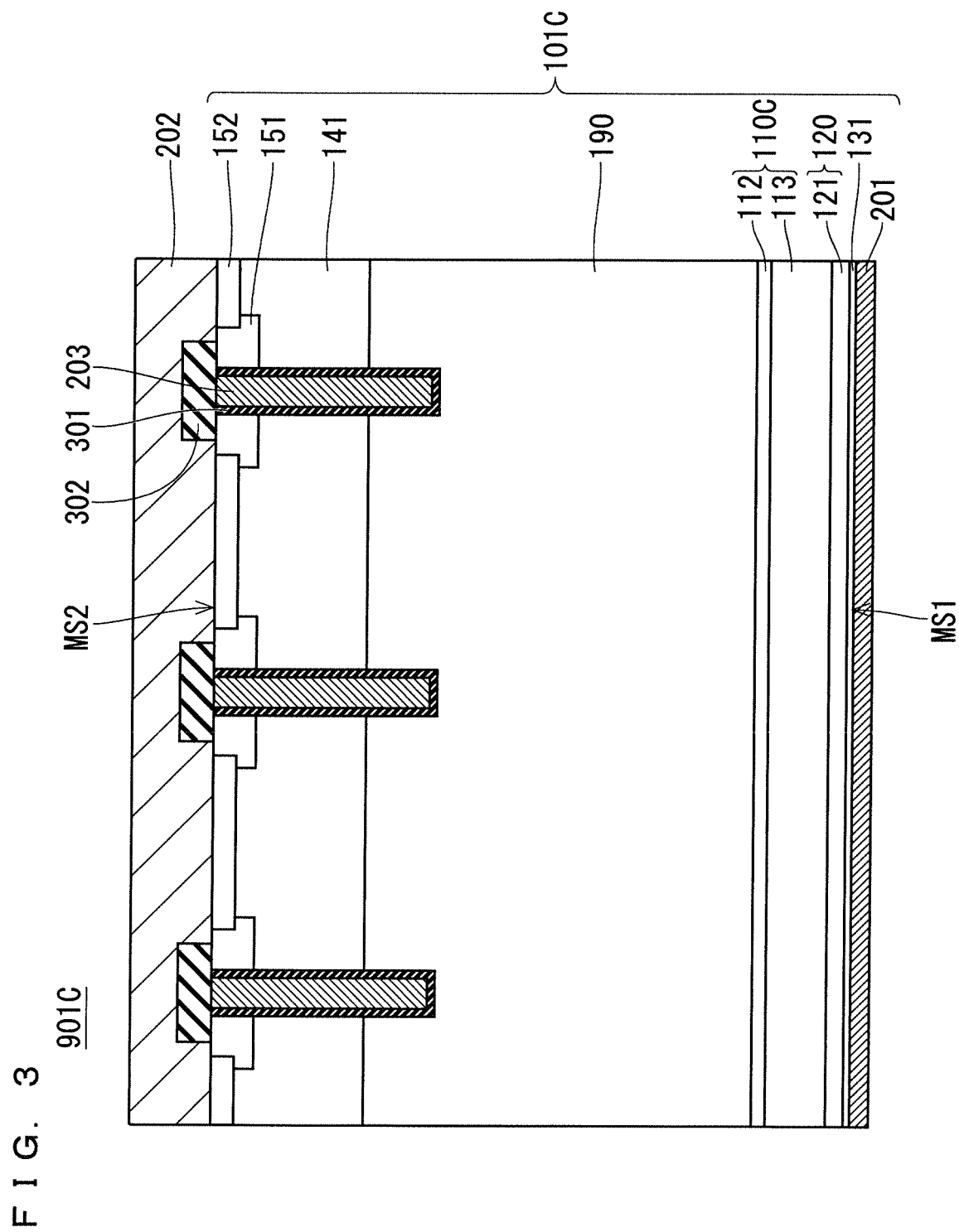
FIG. 3 is a cross-sectional view schematically illustrating a structure of a semiconductor device of a comparative example.
Figure 4:
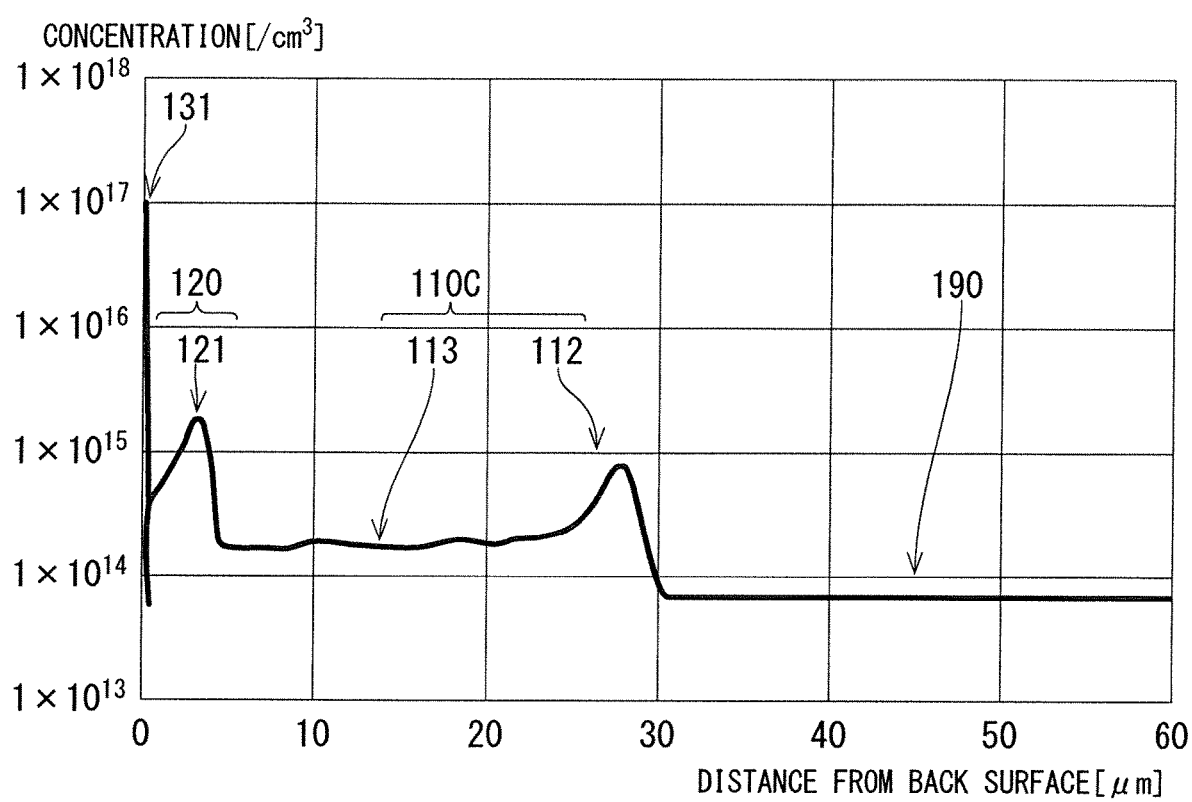
FIG. 4 is a graph illustrating an example impurity concentration profile near a back surface of a semiconductor substrate in FIG. 3.

FIG. 3 is a cross-sectional view schematically illustrating a structure of an IGBT 901C (a semiconductor device) of a comparative example. FIG. 4 is a graph illustrating an example impurity concentration profile near a back surface MS1 of a wafer 101C (a semiconductor substrate) in FIG. 3. A first buffer layer 110C of the wafer 101C (FIG. 3) does not include the first region 111, unlike the first buffer layer 110 of the wafer 101 (FIG. 1: Embodiment 1). Thus, a decrease of the impurity concentration profile from the position of the maximum value in the second region 112 toward the drift layer 190 is steeper in the case of the first buffer layer 110C (FIG. 4) than in the case of the first buffer layer 110 (FIG. 2).

Figure 5:
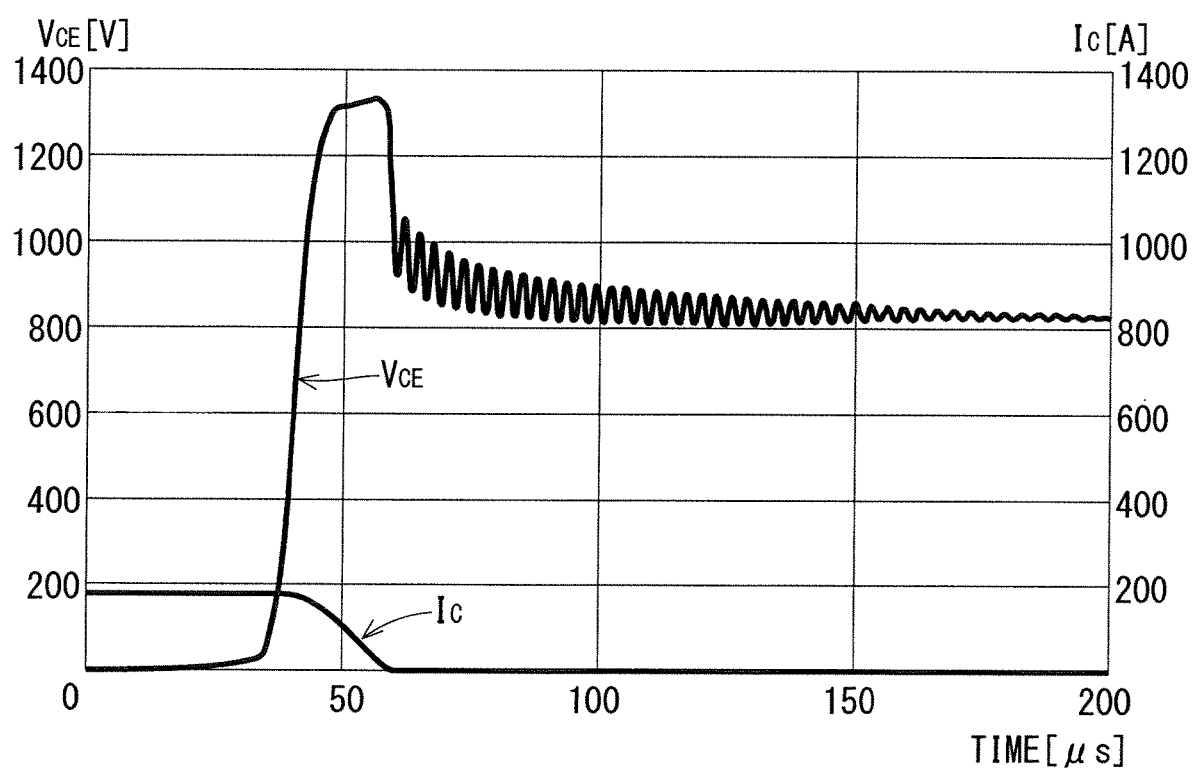
FIG. 5 is a graph illustrating example turn-off waveforms obtained from a simulation on the semiconductor device according to Embodiment 1.

FIG. 5 is a graph illustrating example turn-off waveforms obtained from a simulation in which use of the semiconductor device according to Embodiment 1 which belongs to a 1200 V breakdown-voltage class is assumed. FIG. 6 is a graph illustrating example turn-off waveforms obtained from a simulation in which use of the semiconductor device of the comparative example which belongs to a 1200 V breakdown-voltage class is assumed. In each of the graphs, the horizontal axis represents a time, the vertical axis to the left represents a collector-to-emitter voltage $V_{CE}$, and the vertical axis to the right represents a collector current $I_C$. These simulation results show that oscillations at turn-off in the semiconductor device according to Embodiment 1 are suppressed more than those in the comparative example.

Modification 1 of Embodiment 1

Figure 7:
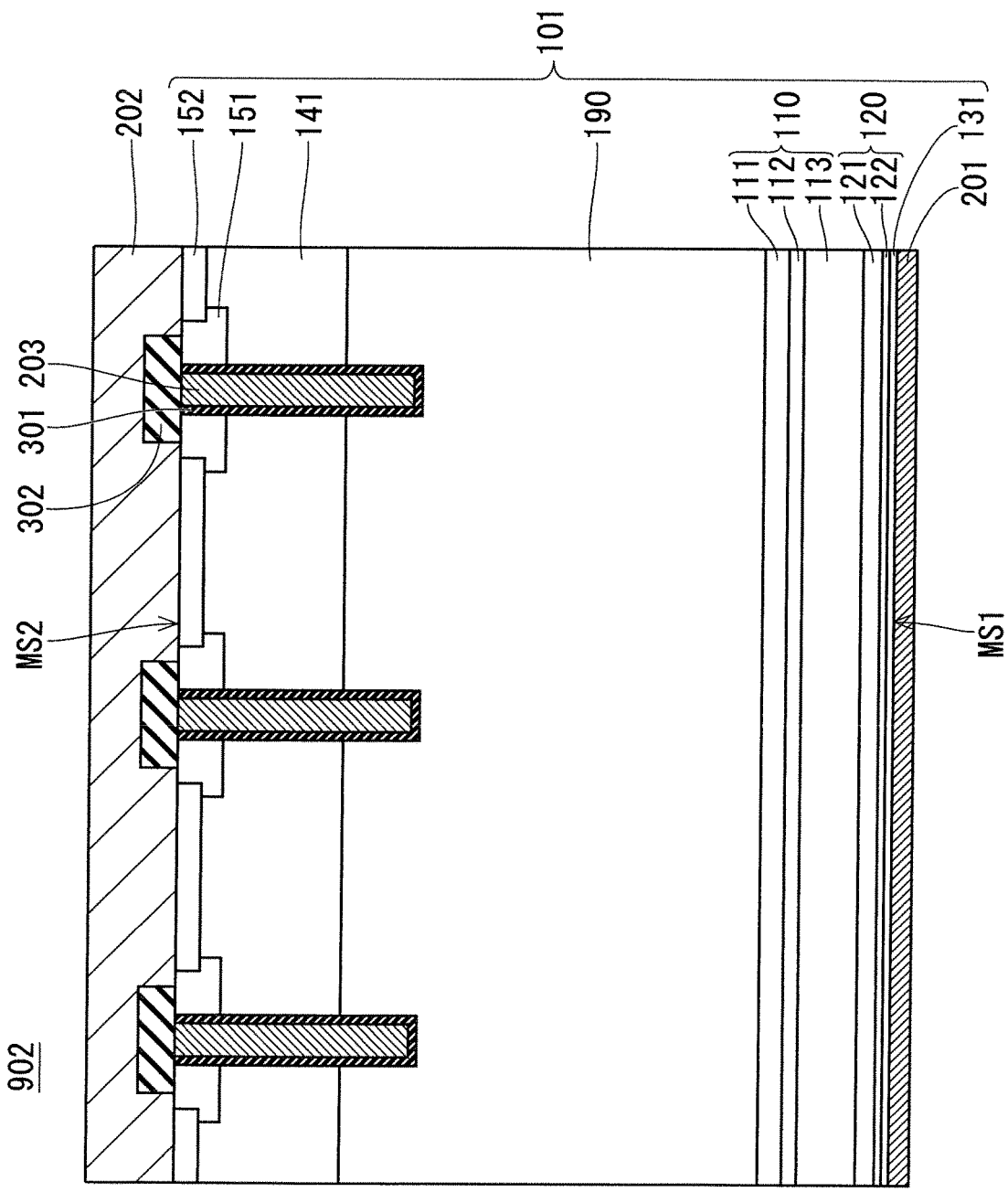
FIG. 7 is a cross-sectional view schematically illustrating a structure of a semiconductor device according to Modification 1 of Embodiment 1.
Figure 8:
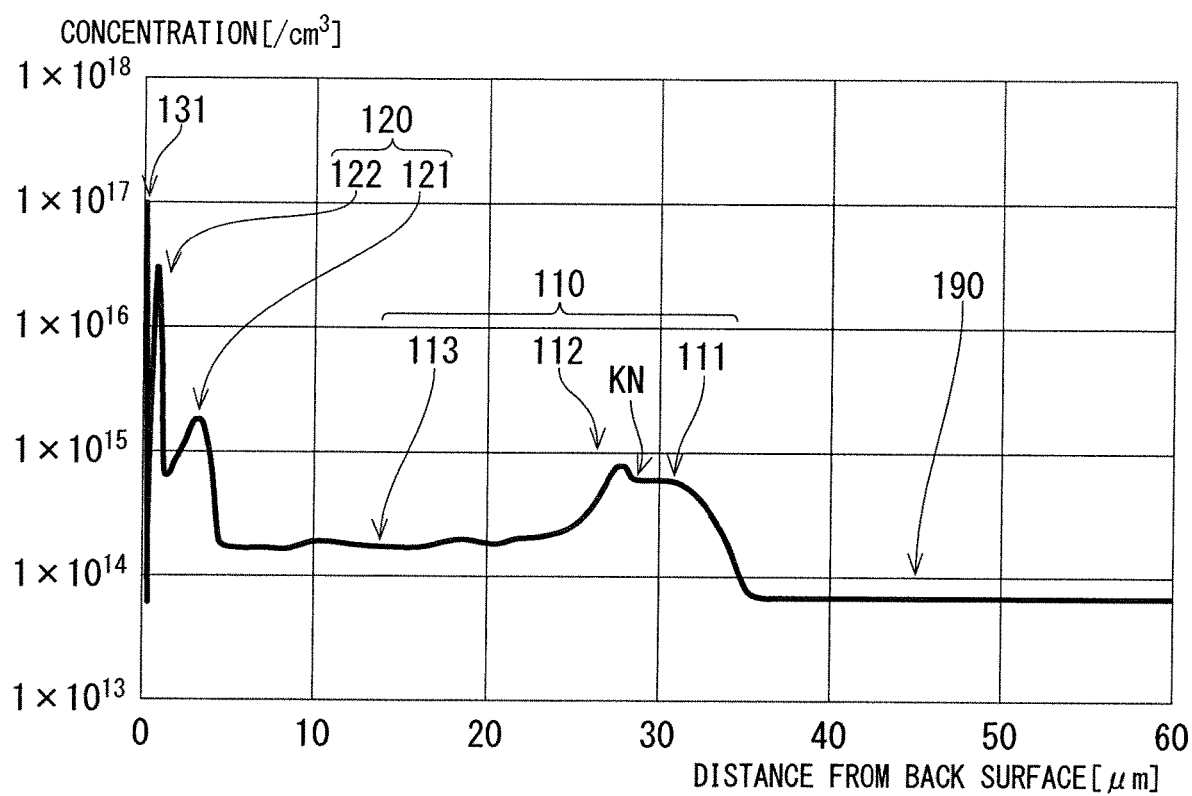
FIG. 8 is a graph illustrating an example impurity concentration profile near a back surface of a semiconductor substrate in FIG. 7.

FIG. 7 is a cross-sectional view schematically illustrating a structure of an IGBT 902 (a semiconductor device) according to Modification 1 of Embodiment 1. FIG. 8 is a graph illustrating an example impurity concentration profile near a back surface MS1 of a wafer 101 in FIG. 7.

The second buffer layer 120 in the IGBT 902 includes a fifth region 122. The fifth region 122 contains non-proton impurities with an effective concentration higher than that of protons. The non-proton impurities may include phosphorus.

The impurity concentration profile of the second buffer layer 120 in the IGBT 902 has a plurality of local maximum values. The plurality of local maximum values include a first local maximum value at a first position (to the right in FIG. 8) in a thickness direction, and a second local maximum value at a second position (to the left in FIG. 8) in the thickness direction between the first position and the back surface MS1. The second buffer layer 120 contains, at the first position, protons with an effective concentration higher than that of non-proton impurities (specifically, phosphorus), and contains, at the second position, non-proton impurities with an effective concentration higher than that of protons.

FIGS. 9 to 17 are cross-sectional views schematically illustrating respective processes in a method for manufacturing the IGBT 902 (FIG. 7).

Figure 9:
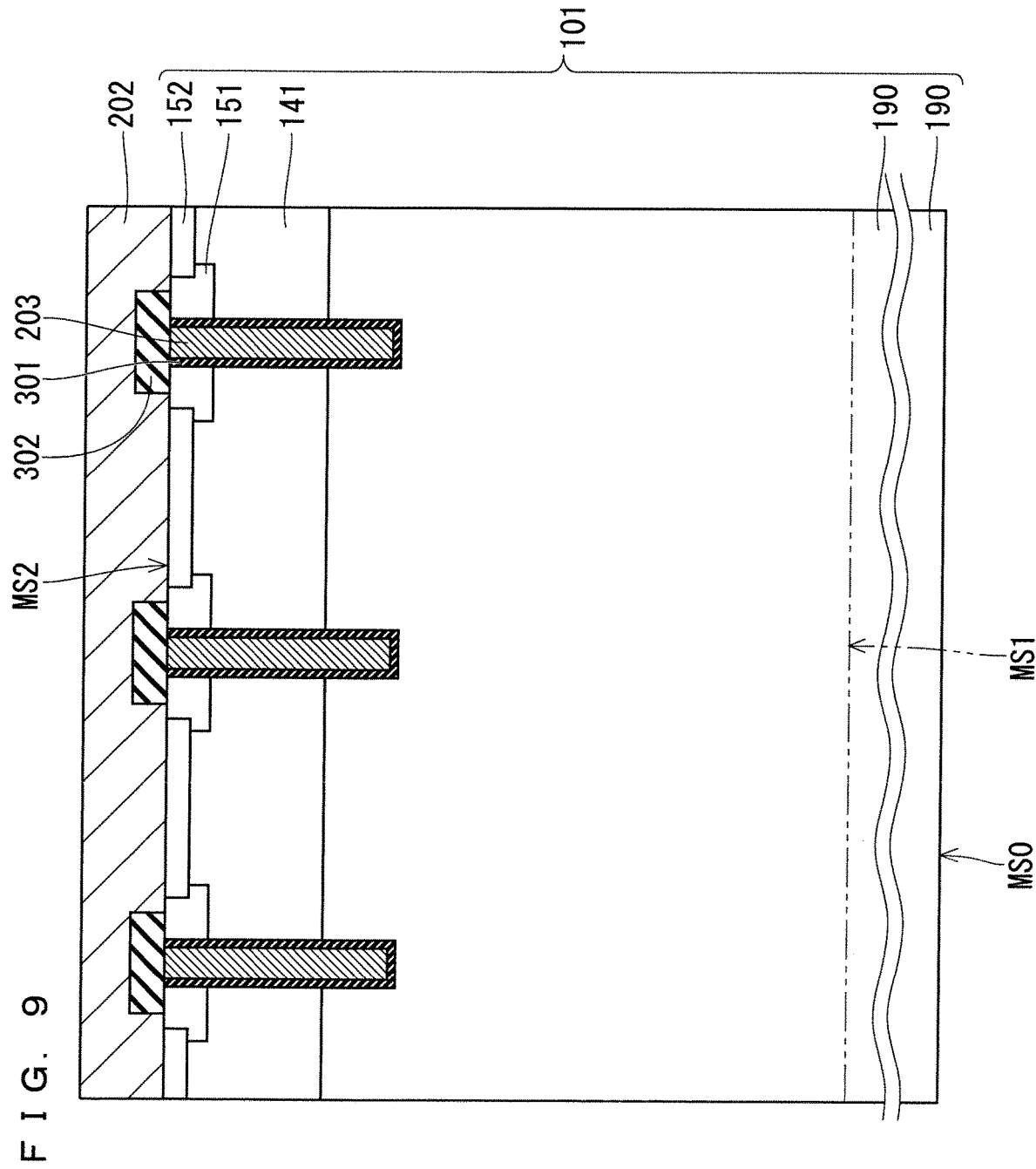
FIG. 9 is a cross-sectional view schematically illustrating a process in a method for manufacturing the semiconductor device in FIG. 7.
Figure 10:
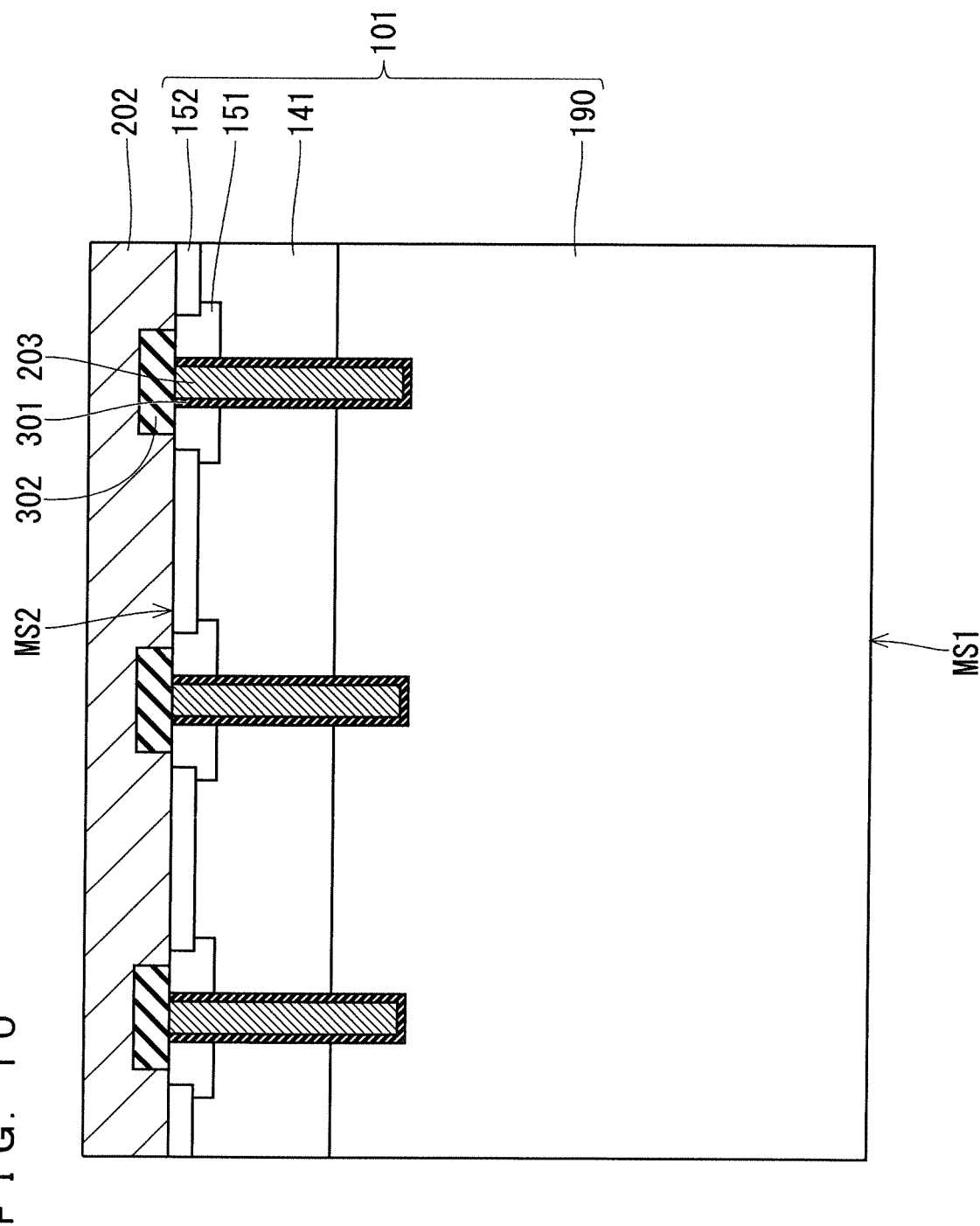
FIG. 10 is a cross-sectional view schematically illustrating a process in the method for manufacturing the semiconductor device in FIG. 7.

With reference to FIG. 9, a bare wafer (a wafer on which a polishing process and a surface process are to be performed, which will be described later) is prepared. The surface process for forming a structure on the top surface MS2 side in the IGBT 902 is performed on the bare wafer. Since this process may be performed based on the normal semiconductor manufacturing technology, the detailed description is omitted. The wafer 101 the surface process of which has been completed is almost identical in thickness to the bare wafer. The wafer 101 has a thickness of, for example, approximately 700 μm. Next, a back surface MS0 is polished, for example, using a grinder or through wet etching. This produces the back surface MS1 as illustrated in FIG. 10.

Figure 11:
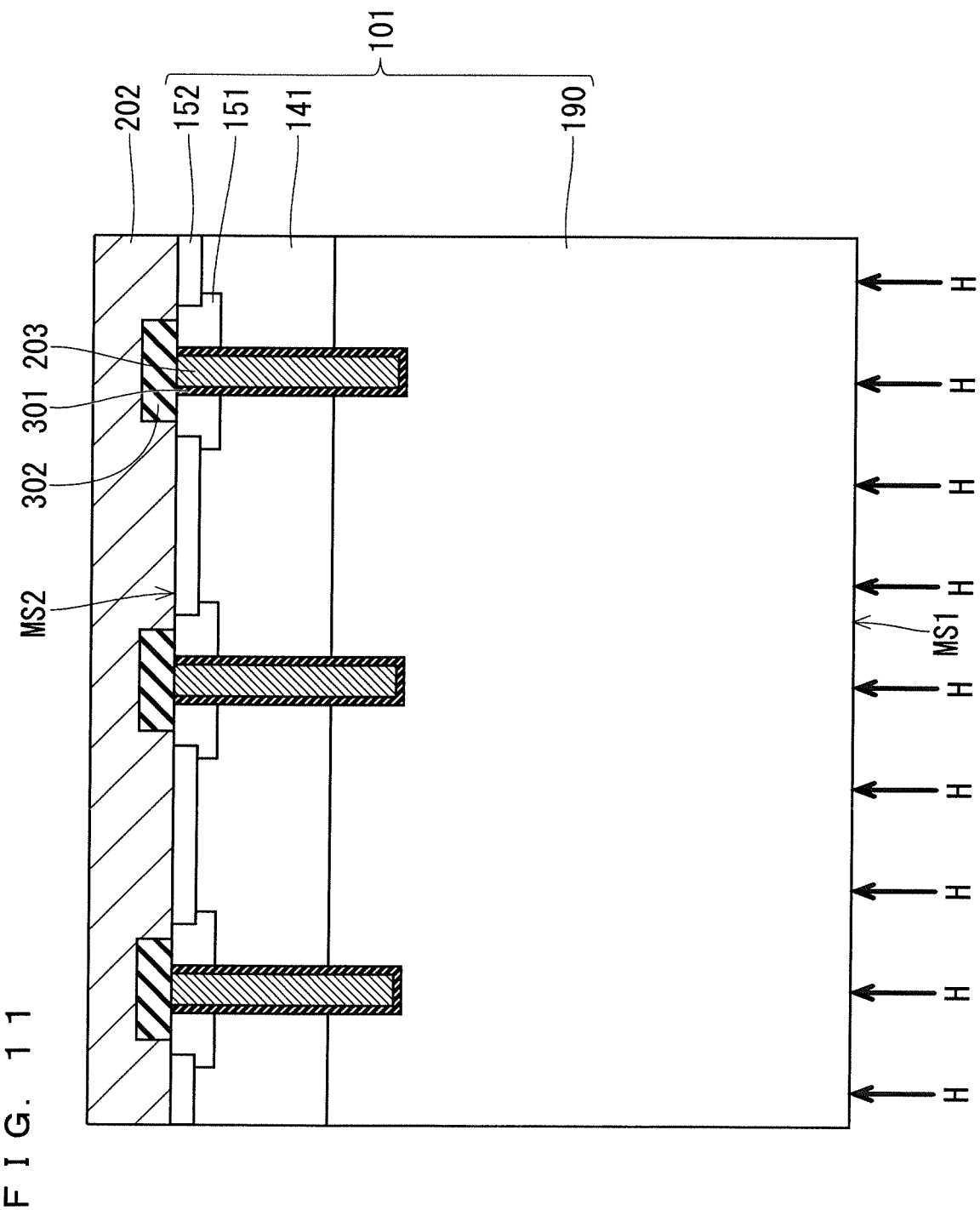
FIG. 11 is a cross-sectional view schematically illustrating a process in the method for manufacturing the semiconductor device in FIG. 7.
Figure 12:
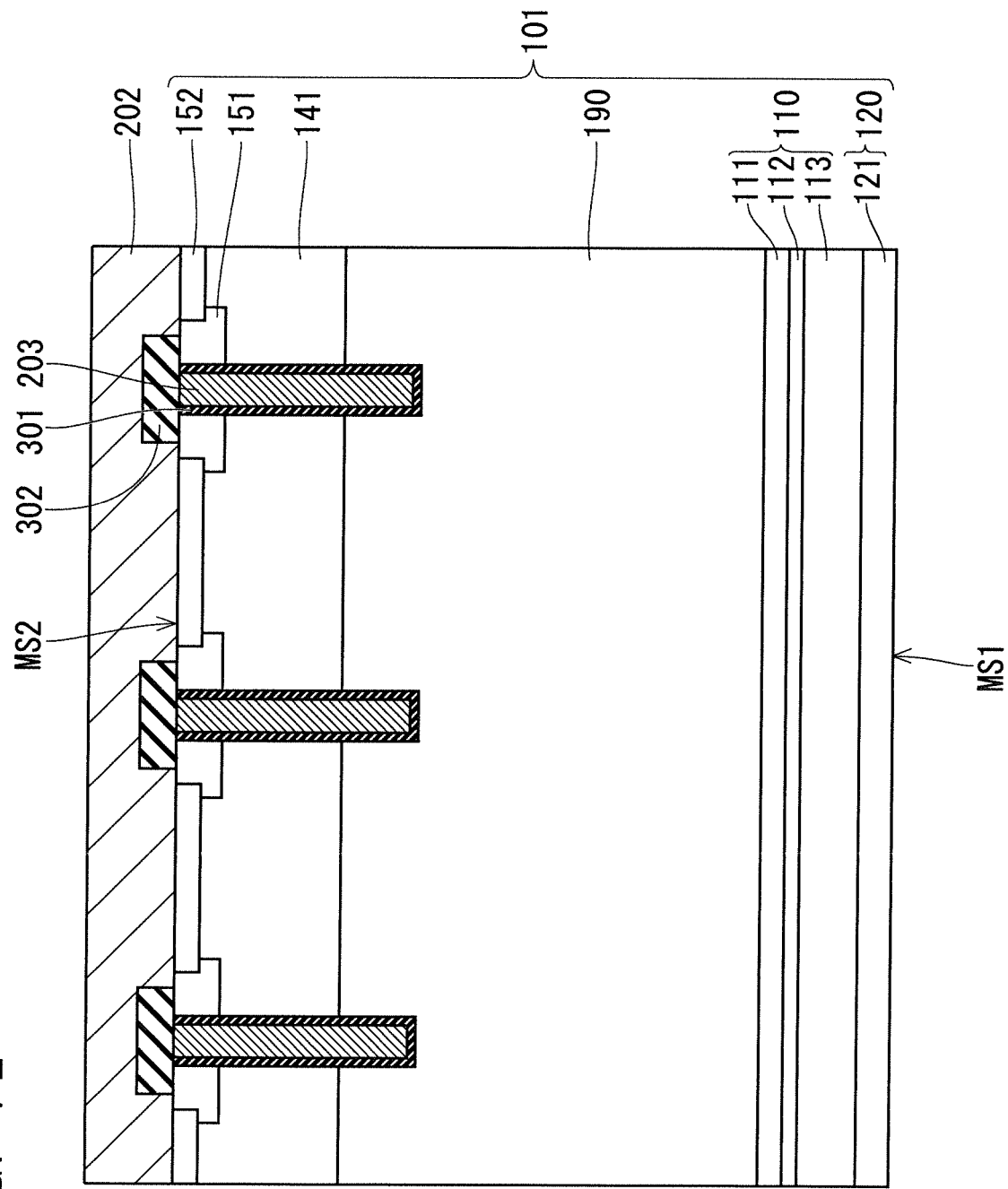
FIG. 12 is a cross-sectional view schematically illustrating a process in the method for manufacturing the semiconductor device in FIG. 7.

With reference to FIG. 11, a proton implanter implants protons (H) to form the first buffer layer 110 and the fourth region 121 of the second buffer layer 120 (FIGS. 7 and 8). At least two implantation processes with different accelerating voltages are performed to form the first buffer layer 110 and the fourth region 121 of the second buffer layer 120. To form the first buffer layer 110 (FIGS. 7 and 8) with two regions, namely, the second region 112 and the first region 111, two implantation processes with different accelerating voltages may be performed, or single implantation process may be performed using a method to be described later. In the former case, three implantation processes in total are performed; in the latter case, two implantation processes in total are performed. In either of the cases, at least one of additional proton implantation process may be performed to adjust the shape of the impurity concentration profile. After the completion of proton implantation, a heat treatment such as furnace annealing is performed at a temperature ranging from approximately 300° C. to 500° C. This causes protons to generate donors. Consequently, the fourth region 121 of the second buffer layer 120 and the first buffer layer 110 are formed as illustrated in FIG. 12.

A mechanism for generating donors from protons will be described below. Proton implantation introduces hydrogen into a wafer, and simultaneously ejects silicon atoms at lattice locations to form lattice defects such as electron holes. The lattice defects react with light-element impurities such as oxygen or carbon included in a silicon substrate to form complexes. A subsequent heat treatment bonds the complexes with hydrogen to generate donors. A mechanism for generating donors will be described below.

Figure 13:
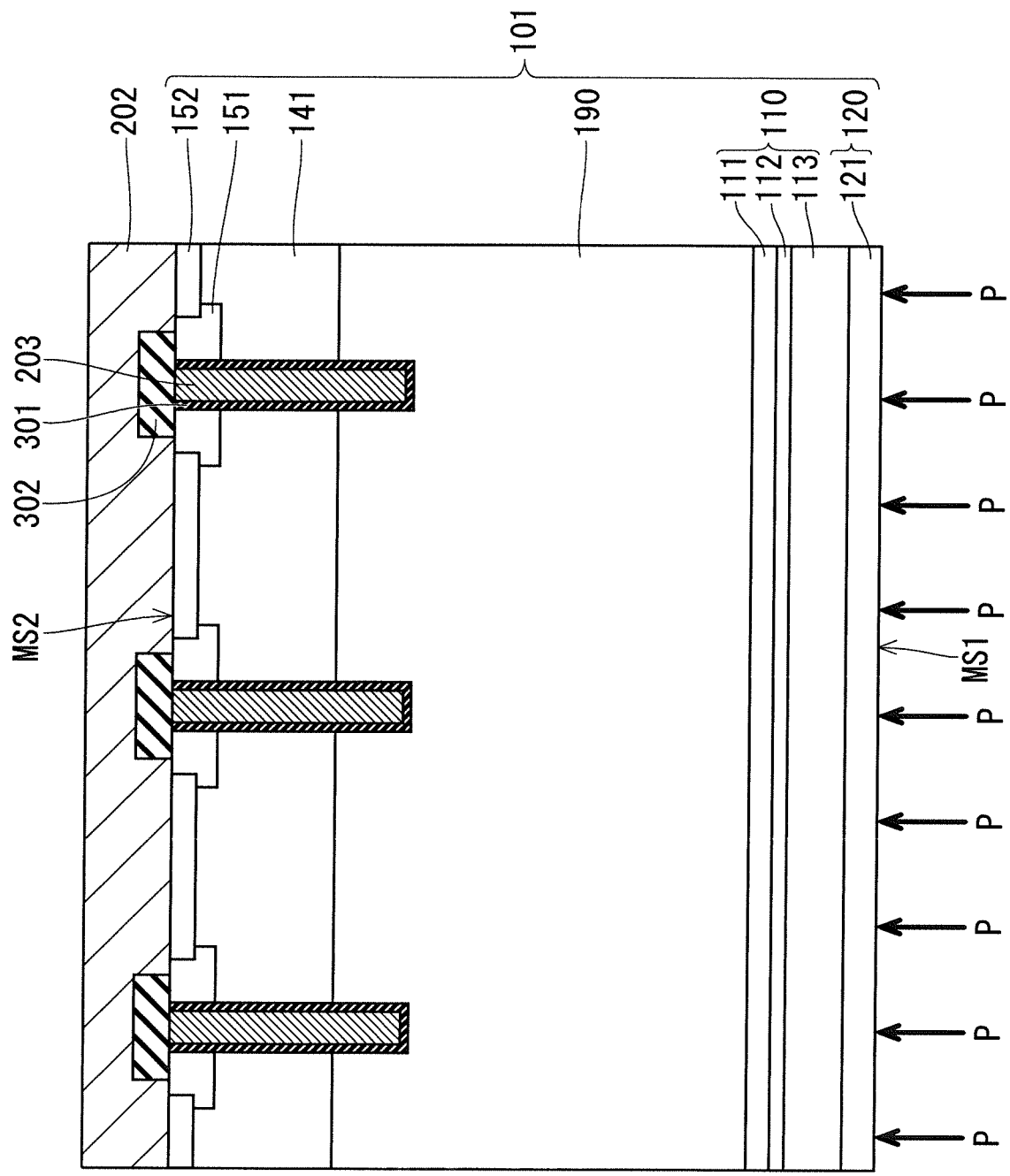
FIG. 13 is a cross-sectional view schematically illustrating a process in the method for manufacturing the semiconductor device in FIG. 7.
Figure 14:
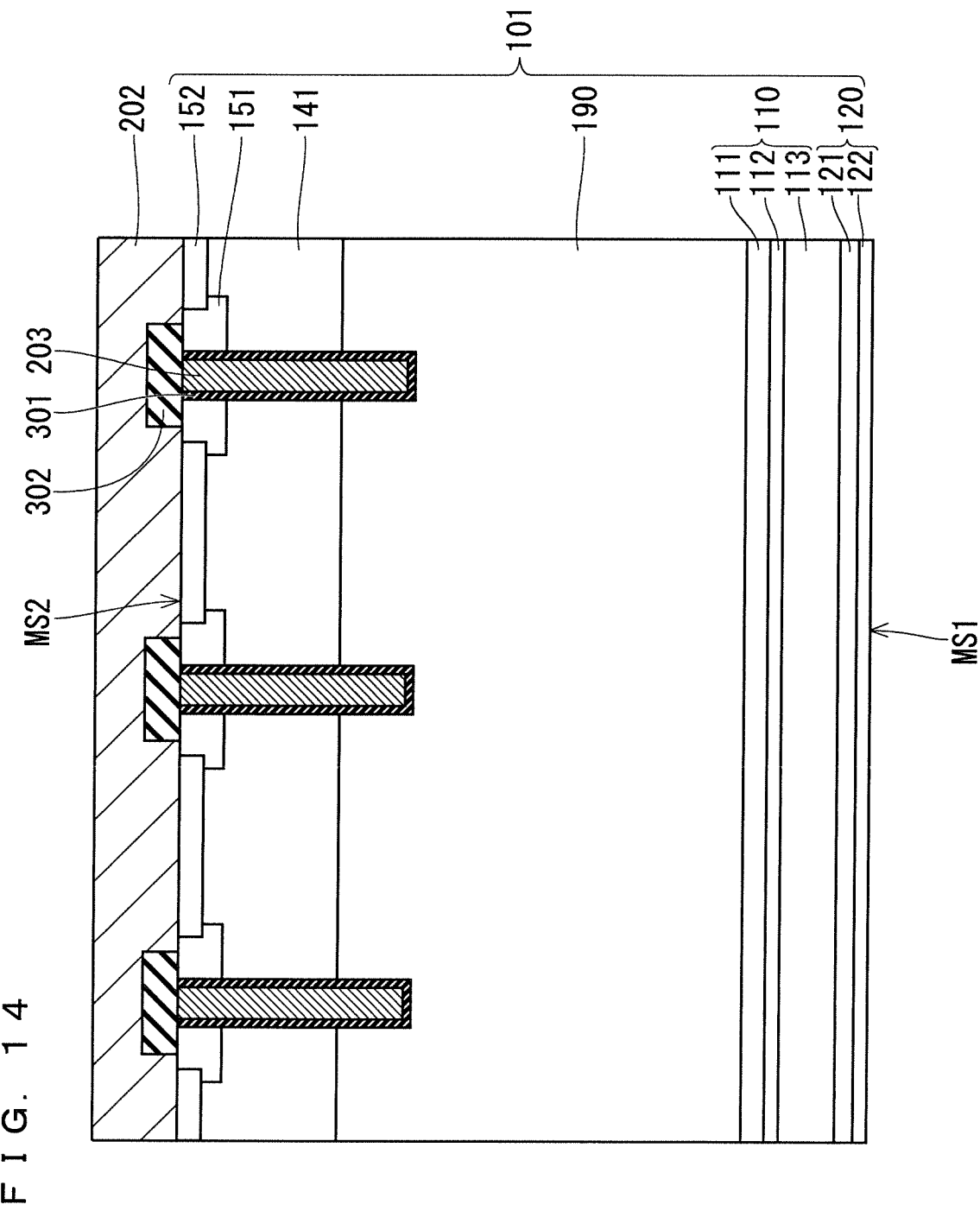
FIG. 14 is a cross-sectional view schematically illustrating a process in the method for manufacturing the semiconductor device in FIG. 7.

With reference to FIG. 13, phosphorus (P) is implanted into the back surface MS1 at a shallow depth. Then, a heat treatment such as laser annealing is performed. Consequently, the fifth region 122 of the second buffer layer 120 is formed as illustrated in FIG. 14. Omitting this process can manufacture the IGBT 901 (FIGS. 1 and 2: Embodiment 1) instead of the IGBT 902 (FIGS. 7 and 8).

Figure 15:
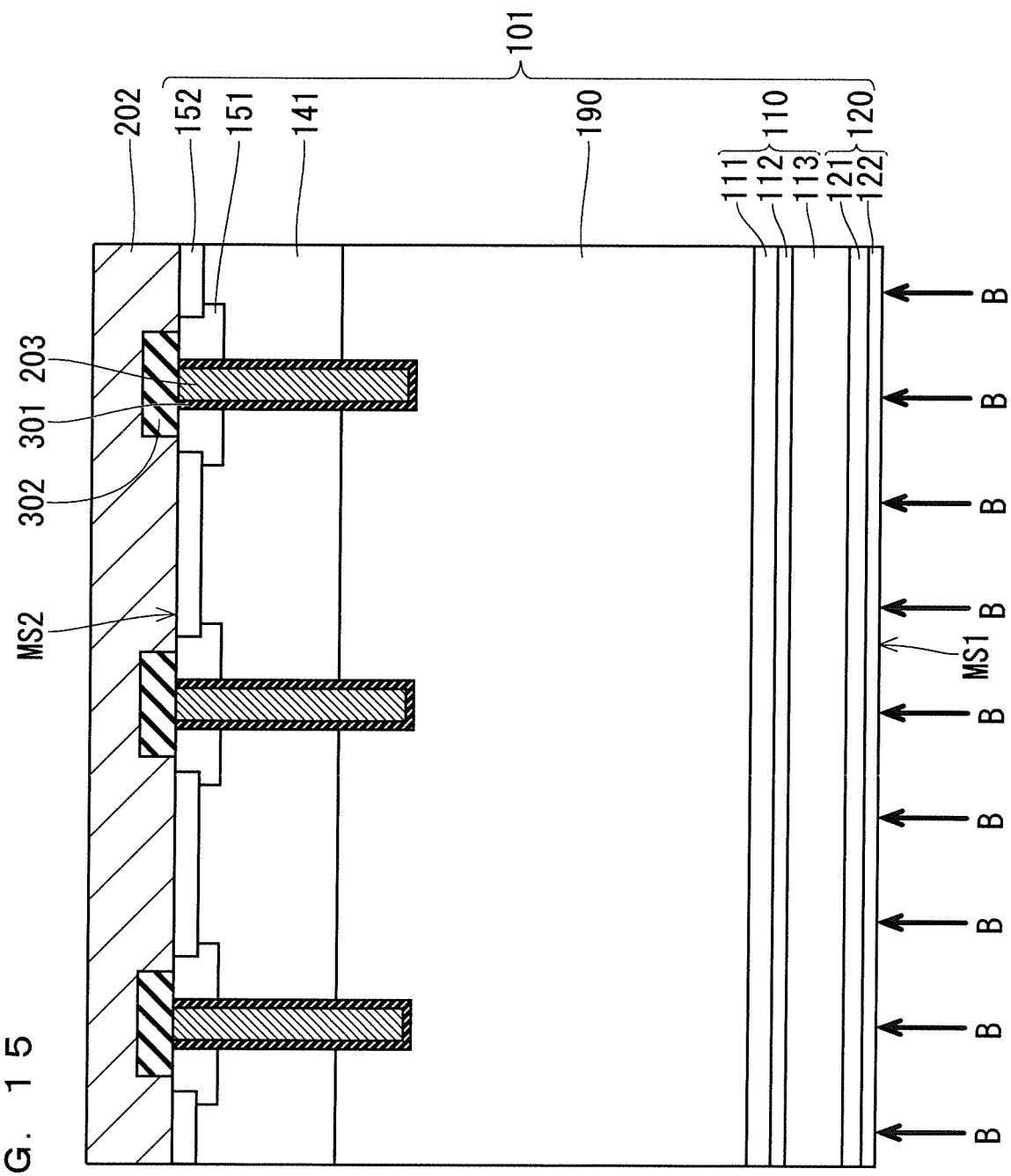
FIG. 15 is a cross-sectional view schematically illustrating a process in the method for manufacturing the semiconductor device in FIG. 7.
Figure 16:
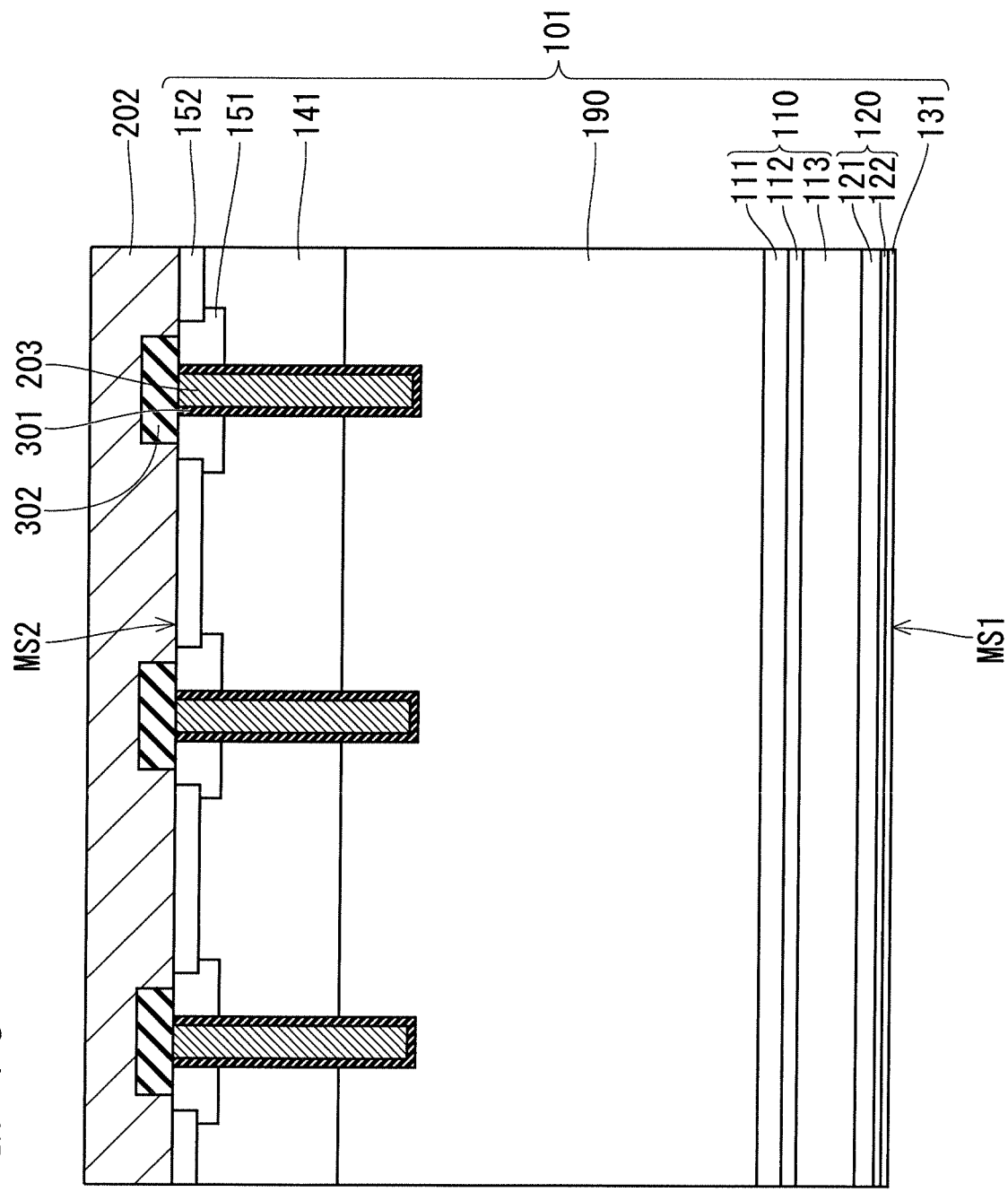
FIG. 16 is a cross-sectional view schematically illustrating a process in the method for manufacturing the semiconductor device in FIG. 7.

With reference to FIG. 15, boron (B) is implanted into the back surface MS1 at a shallow depth. Then, a heat treatment such as laser annealing is performed. This produces the collector layer 131 as illustrated in FIG. 16.

As long as the furnace annealing is performed after proton implantation and the laser annealing is performed after phosphorus implantation and boron implantation, the order of processes including proton implantation, the furnace annealing, phosphorus implantation, boron implantation, and the laser annealing may be appropriately altered for convenience of the manufacturing.

Figure 17:
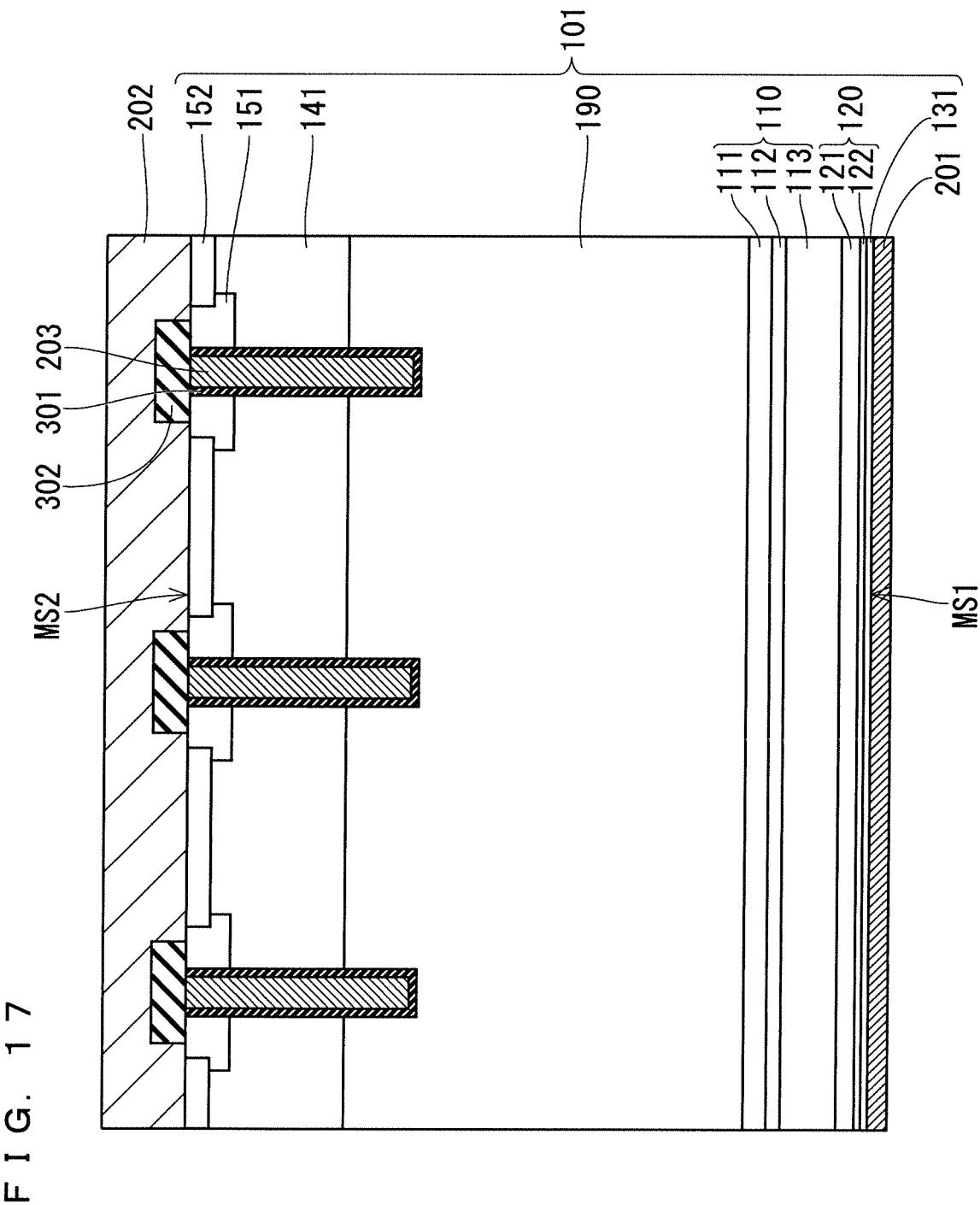
FIG. 17 is a cross-sectional view schematically illustrating a process in the method for manufacturing the semiconductor device in FIG. 7.

With reference to FIG. 17, the collector electrode layer 201 is formed by, for example, sputtering. The collector electrode layer 201 may be made of a laminate such as Al/Ti/Ni/Au or AlSi/Ti/Ni/Au. Next, a heat treatment for reducing contact resistance between the collector electrode layer 201 and the wafer 101 is performed.

Consequently, the IGBT 902 (FIG. 7) is obtained.

The technology for generating donors using the aforementioned proton implantation (FIGS. 11 and 12) will be described below.

Figure 18:
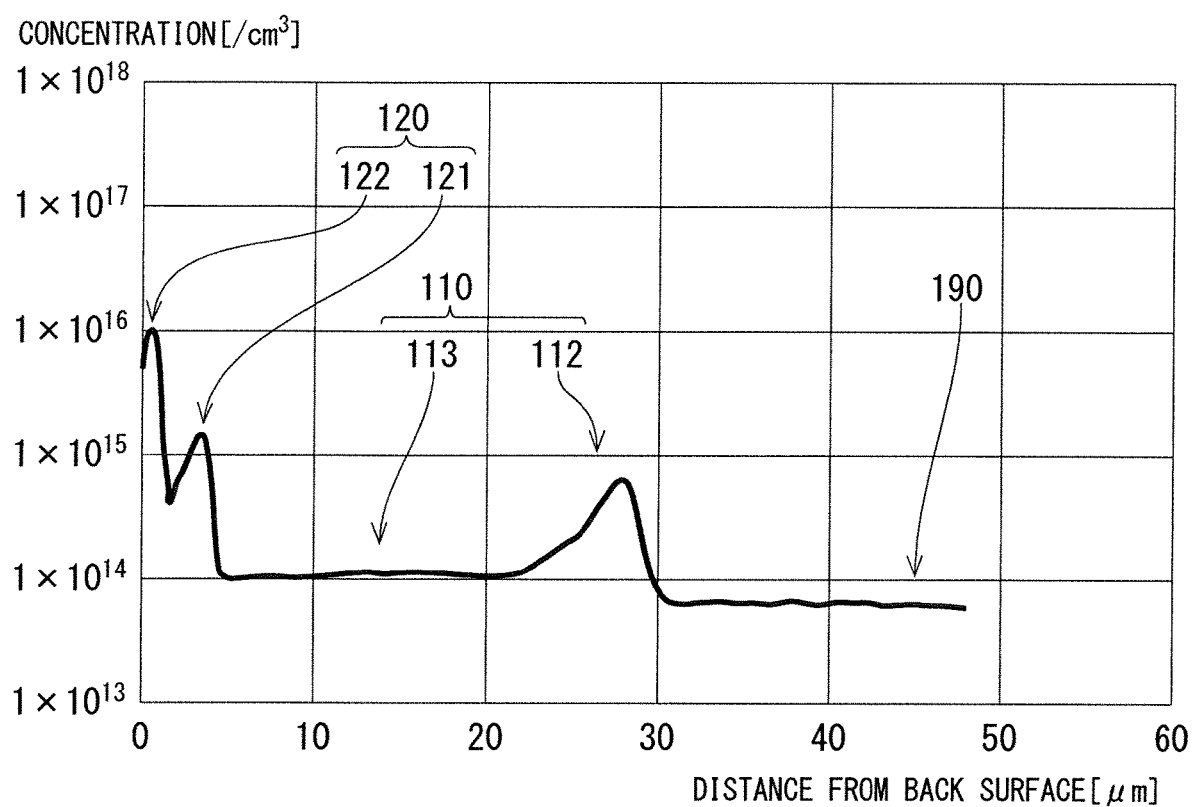
FIG. 18 is a graph illustrating an impurity concentration profile of a semiconductor device obtained by a manufacturing method including two proton implantation processes into a semiconductor substrate with a concentration of oxygen lower than that of FIG. 19, where the impurity concentration profile has been measured using resistance measurements.
Figure 19:
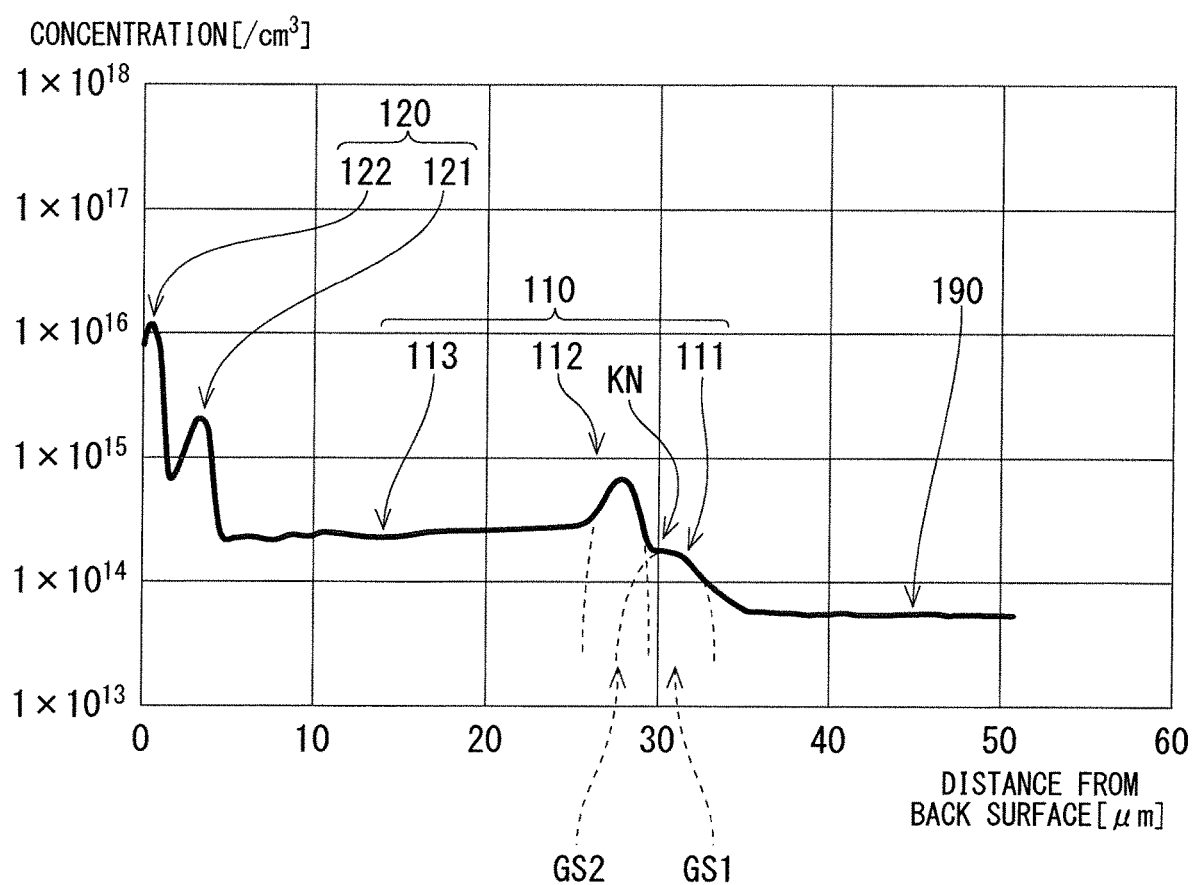
FIG. 19 is a graph illustrating an impurity concentration profile of a semiconductor device obtained by the manufacturing method including two proton implantation processes into a semiconductor substrate with a concentration of oxygen higher than that of FIG. 18, where the impurity concentration profile has been measured using the resistance measurements.

FIGS. 18 and 19 are graphs each illustrating an impurity concentration profile of an IGBT obtained by a manufacturing method including the two proton implantation processes into a wafer. The impurity concentration profile has been measured using the spreading resistance (SR) measurements. In the SR measurements, a portion in the vicinity whose distance from the back surface MS1 is zero is not observed in terms of the measurement method. Thus, the collector layer 131 (FIG. 8) was not observed. Of the two proton implantation processes, one is intended to implant protons near a depth position at which the fourth region 121 of the second buffer layer 120 is to be formed, and the other is intended to implant protons near a depth position at which the second region 112 of the first buffer layer 110 is to be formed. A difference between FIGS. 18 and 19 is that the wafer in FIG. 19 has a concentration of oxygen higher than that of the wafer in FIG. 18.

As described above, the mechanism for generating donors from protons is considered to be relevant to oxygen included in a silicon substrate. Thus, a concentration of oxygen in a wafer significantly impacts contribution of protons to an impurity concentration profile. Specifically, in FIG. 18 where the concentration of oxygen of the IGBT was relatively low, the peak of the second region 112 was formed in an almost isolated manner. In FIG. 19 where the concentration of oxygen of the IGBT was higher, not only the second region 112 but also the first region 111 adjacent to the second region 112 was formed. This probable mechanism is that a part of hydrogen accumulated by proton implantation into a region in which the second region 112 is to be formed is diffused by the heat treatment after the implantation up to a region in which the first region 111 is to be formed and that the diffused hydrogen reacts with the wafer with a high concentration of oxygen to form the first region 111.

Figure 20:
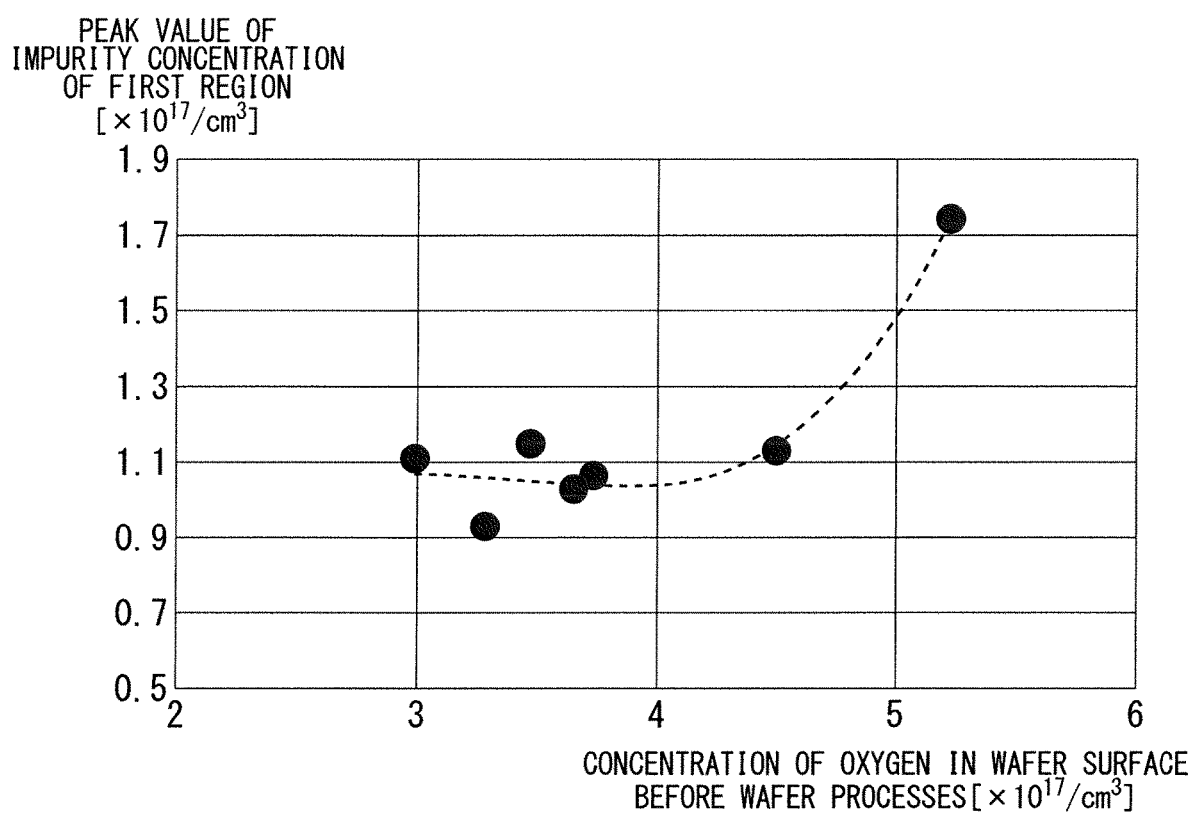
FIG. 20 is a graph illustrating a result of measurements on a relationship between a concentration of oxygen in a semiconductor substrate before wafer processes and a peak value of a Gaussian approximation of a first region in a first buffer layer.

FIG. 20 is a graph illustrating a result of measurements on a relationship between a concentration of oxygen in the wafer 101 before wafer processes and a peak value of a Gaussian approximation of the first region 111 in the first buffer layer 110. The Gaussian approximation is performed using the Gaussian distribution GS1 and the Gaussian distribution GS2 as performed in FIG. 2. The peak value in the vertical axis of FIG. 20 is a peak value of the Gaussian distribution GS1. The back surface MS1 of the wafer 101 is located at a greater depth from the back surface MS0 (FIG. 9) of the bare wafer. Thus, the back surface MS1 is hardly subject to the influence of a decrease in the concentration of oxygen when oxygen is diffused in the wafer processes. Thus, a concentration of oxygen from the back surface MS1 to a position at which the first region 111 is to be formed in the process of proton implantation is probably almost equal to that of the wafer 101 before the wafer processes.

The result shown in FIG. 20 concludes that an increase in a concentration of oxygen in the back surface MS1 can form the first region 111, as well as the second region 112, with a sufficient impurity concentration. In view of an approximation curve (a broken line) in FIG. 20, the concentration of oxygen in the back surface MS1 is preferably higher than or equal to $4.5 \times 10^{17}/cm^3$, and is more preferably higher than or equal to $5.0 \times 10^{17}/cm^3$. Furthermore, the back surface MS1 with the concentration of oxygen higher than or equal to $5.2 \times 10^{17}/cm^3$ can more reliably produce an advantage of increasing the impurity concentration of the first region 111. The concentration of oxygen in the back surface MS1 is measured at a position slightly apart from the back surface MS1 inside the wafer 101 (e.g., a position apart by several μm) to avoid an influence of a surface oxide film formed on the back surface MS1. Similarly, a concentration of oxygen in the top surface MS2, which will be described later, is measured at a position slightly apart from the top surface MS2 inside the wafer 101 (e.g., a position apart by several μm).

The technology on forming both of the first region 111 and the second region 112 by single proton implantation process using a wafer with a high concentration of oxygen has been described above. Instead of this, two proton implantation processes with different accelerating voltages including one process that implant protons at depth position of the first region 111 and the other process that implant protons at depth position of the second region 112 may be performed, where the concentration of oxygen in the back surface MS1 is not particularly limited. Alternatively, the back surface MS1 with a concentration of oxygen that is high to a certain extent can provide the first region 111 with a certain extent of an impurity concentration; proton implantation can compensate for the shortage of the impurity concentration.

Figure 21:
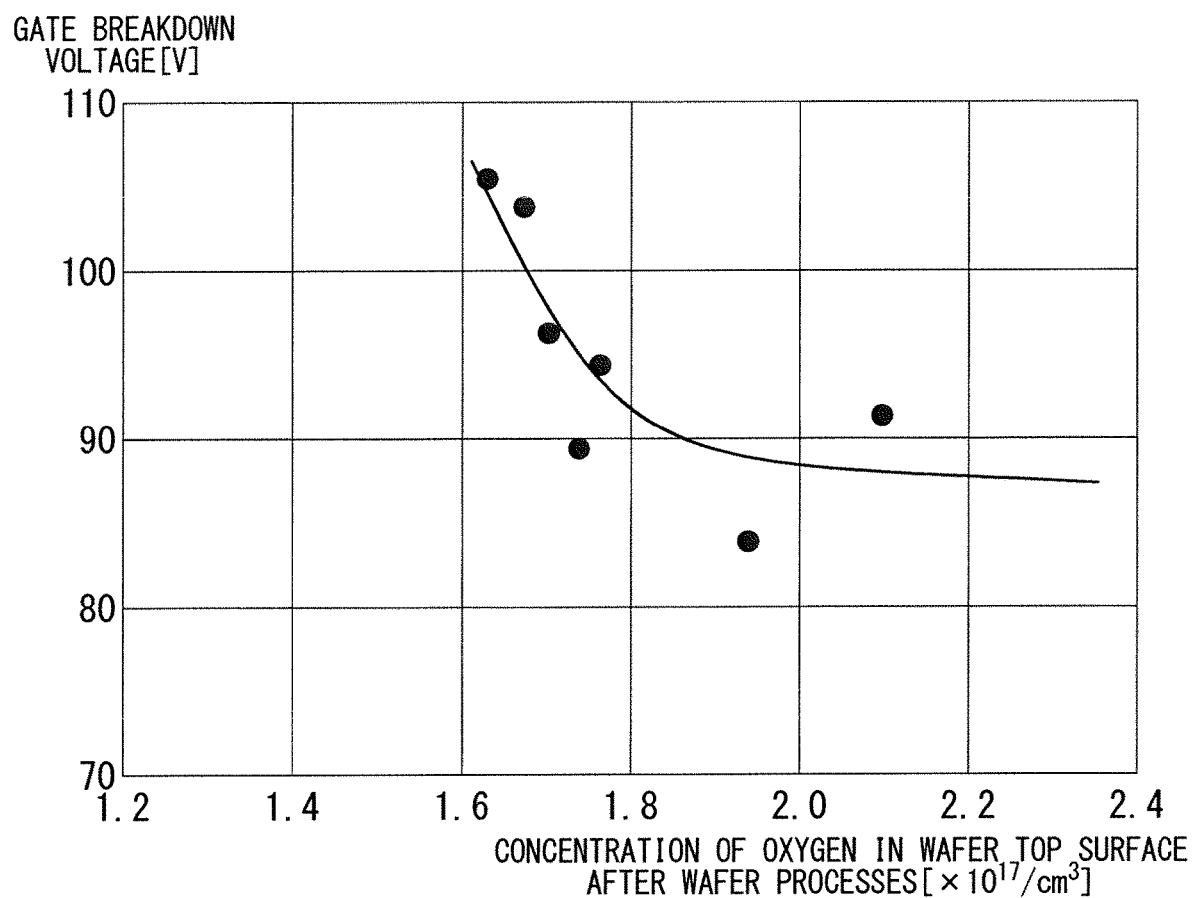
FIG. 21 is a graph illustrating a result of measurements on a relationship between a concentration of oxygen in a front surface of the semiconductor substrate after the wafer processes and a gate breakdown voltage.

FIG. 21 is a graph illustrating a result of measurements on a relationship between a concentration of oxygen in the top surface MS2 of the wafer 101 after the wafer processes and a gate breakdown voltage of the IGBT 901. The result shows that an excessive concentration of oxygen in the top surface MS2 of the wafer 101 reduces the gate breakdown voltage. A probable reason for this is that an excessive concentration of oxygen in portions in which the gate oxide films 301 are to be formed reduces the quality of the gate oxide films 301 in the wafer 101. A part of four bonds of a silicon atom is not used around electron holes that are sort of crystal defects of the wafer 101. Complexes formed of such silicon atoms and oxygen atoms in the wafer 101 may form an oxide film (an inner-wall oxide film of a trench). These complexes detrimentally affect a surface oxidation process for forming the gate oxide films 301. Thus, an excessively high concentration of oxygen in the top surface MS2 reduces the quality of the gate oxide films 301, and consequently reduces the gate breakdown voltage. In view of an approximation curve (a solid line) in FIG. 21, the concentration of oxygen in the top surface MS2 is preferably lower than or equal to $1.8 \times 10^{17}/cm^3$. Furthermore, the top surface MS2 with a concentration of oxygen lower than or equal to $1.7 \times 10^{17}/cm^3$ can more reliably produce an advantage of increasing the gate breakdown voltage.

Consequently, reducing a concentration of oxygen near the top surface MS2 before forming at least the gate electrodes 203 is preferred to increase the gate breakdown voltage. To this end, performing an out-diffusion process of oxygen from the top surface MS2 at a temperature higher than or equal to approximately 1100° C. is effective. The out-diffusion process of oxygen before the process of polishing a wafer (processes from FIG. 9 to FIG. 10) can avoid a decrease in the concentration of oxygen in the back surface MS1 (FIG. 10) although a concentration of oxygen near the back surface MS0 (FIG. 9) decreases. Thus, the technology on forming the first region 111 simultaneously with the second region 112 using a high concentration of oxygen in the back surface MS1 is applicable even after performing the out-diffusion process.

Modification 2 of Embodiment 1

Figure 22:
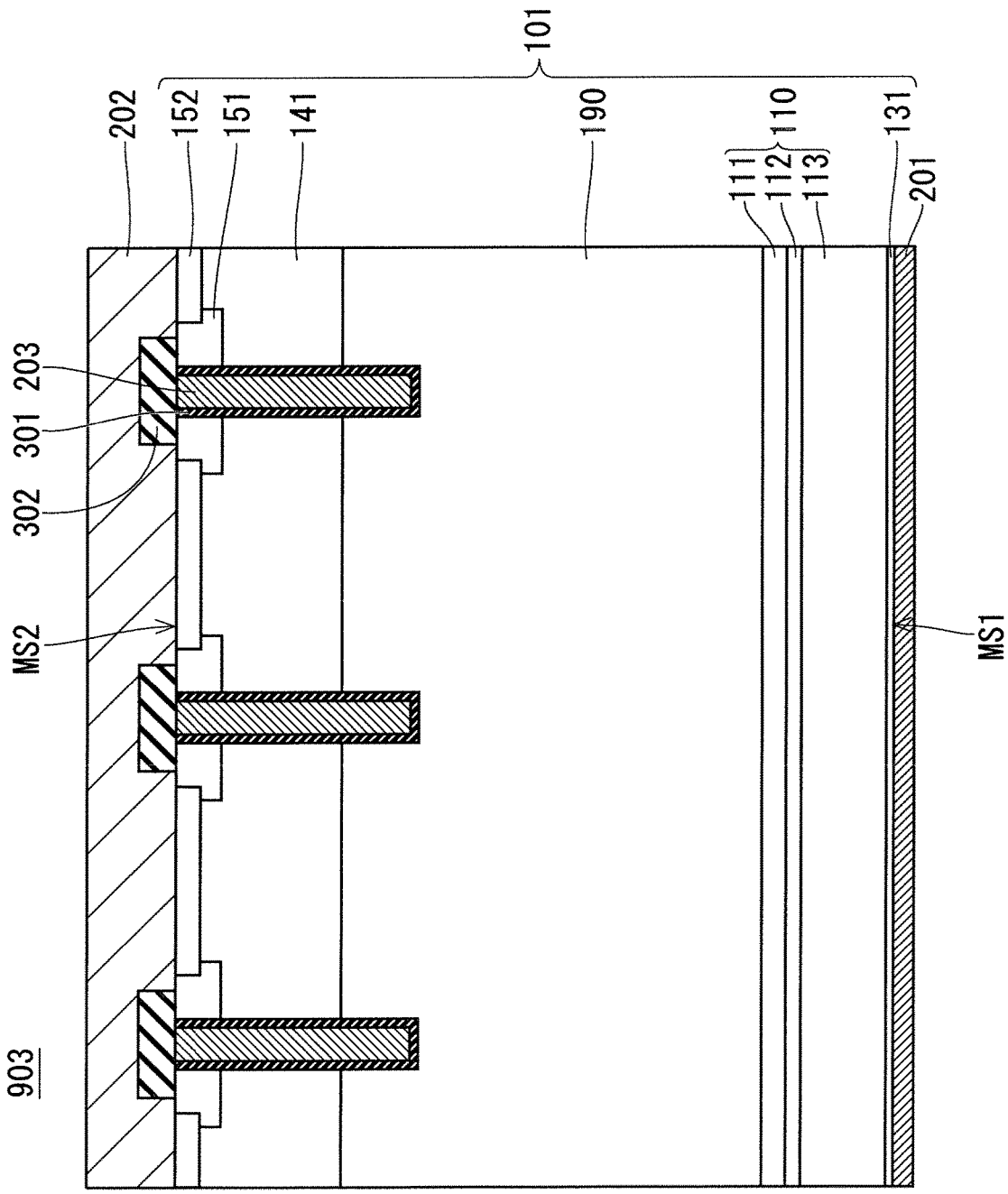
FIG. 22 is a cross-sectional view schematically illustrating a structure of a semiconductor device according to Modification 2 of Embodiment 1.
Figure 23:
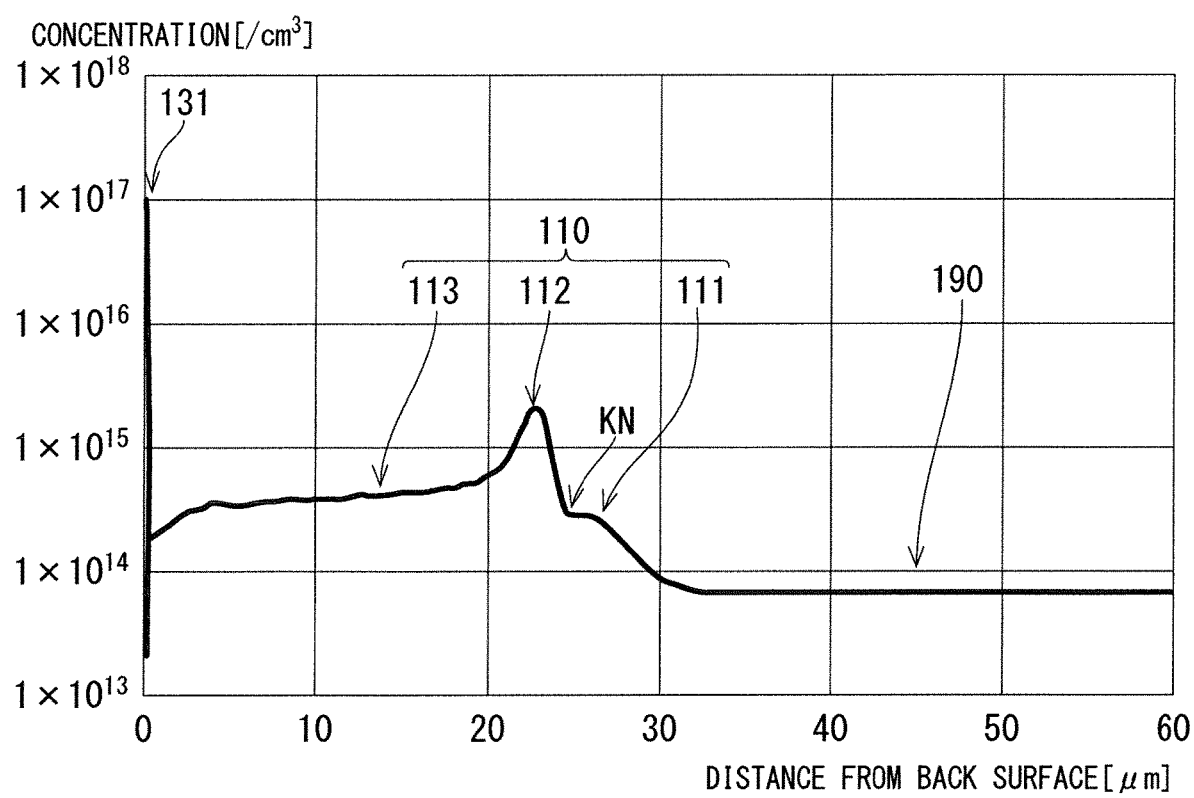
FIG. 23 is a graph illustrating an example impurity concentration profile near a back surface of a semiconductor substrate in FIG. 22.

FIG. 22 is a cross-sectional view schematically illustrating a structure of an IGBT 903 (a semiconductor device) according to Modification 2 of Embodiment 1. FIG. 23 is a graph illustrating an example impurity concentration profile near a back surface MS1 of a wafer 101 in FIG. 22. The wafer 101 in the IGBT 903 (FIGS. 22 and 23) does not include the second buffer layer 120 (FIGS. 1 and 2: Embodiment 1). The IGBT 903 (FIG. 22) can be obtained by omitting a process of forming the second buffer layer 120 from the method for manufacturing the IGBT 902 (FIGS. 7 and 8) which has already been described in detail. Adjusting, in the impurity concentration profile illustrated in FIG. 23, conditions relevant to the first buffer layer 110 in the manufacturing method can adjust a percentage of a value at the boundary point KN to the maximum value of the impurity concentration profile of the first buffer layer 110 (i.e., the maximum value in the second region 112). Thus, the value at the boundary point KN can be adjusted to higher than or 10 equal to 80% of the maximum value, similarly to Embodiment 1 (FIG. 2).

Advantages of Embodiment 1(FIGS. 1 and 2)

In the IGBT 901, first, the first region 111 and the second region 112 in the first buffer layer 110 contain protons. Since protons can be easily implanted into the wafer 101 deeper than other impurities, the first region 111 and the second region 112 in the first buffer layer 110 can be formed at deep positions from the back surface MS1 of the wafer 101 using protons. Second, the impurity concentration profile of the first buffer layer 110 has a position of its maximum value in the second region 112, and has a kink where a decrease of the impurity concentration from the position toward the drift layer 190 is relaxed or stopped at the boundary point KN between the second region 112 and the first region 111; furthermore, the impurity concentration at the boundary point KN is higher than or equal to 80% of the maximum value. This relaxes the slope of the profile from the position of the maximum value toward the drift layer 190, near the position of the maximum value. Thus, the first buffer layer 110 can prevent the depletion layer from extending from the drift layer 190 toward the first principal surface MS1 in the wafer 101 at turn-off in a relax manner in time and space. Third, the first buffer layer 110 includes the third region 113 having a thickness of 5 μm or more between the second region 112 with the maximum value of the impurity concentration and the back surface MS1 of the wafer 101. This enables carriers to stay over a wide region in the thickness direction between the depletion layer whose extension has been prevented and the back surface MS1 of the wafer 101 at turn-off. Thus, oscillations at turn-off can be effectively suppressed.

The distribution of the third region 113 in the impurity concentration profile may be maintained within 20% of a representative value. This can stably exercise functions of the third region 113 at turn-off.

The wafer 101 may further include, between the back surface MS1 and the first buffer layer 110, the second buffer layer 120 of n-type which is higher in impurity concentration than the third region 113 in the first buffer layer 110. Thus, oscillations at turn-off can be more effectively suppressed.

The first concentration of oxygen in the back surface MS1 of the wafer 101 may be higher than the second concentration of oxygen in the top surface MS2 of the wafer 101. Since the concentration of oxygen near the back surface MS1 is relatively higher than that near the top surface MS2, the first region 111 in the first buffer layer 110 can be easily formed from protons. Since the concentration of oxygen near the top surface MS2 is relatively lower than that near the back surface MS1, the gate breakdown voltage can be increased. These can increase the production efficiency of processes for forming the first region 111 in the first buffer layer 110, and can increase the gate breakdown voltage.

Additional Advantages of Modification 1(FIGS. 7 and 8)

The second buffer layer 120 may include a region with non-proton impurities higher in effective concentration than protons as n-type impurities. Since the second buffer layer 120 is shallower than the first buffer layer 110 with respect to the back surface MS1, even non-proton impurities with difficulty in being implanted deeper than protons, may be easily sufficiently implanted from the back surface MS1.

The non-proton impurities may include phosphorus. This can secure a high activation percentage of impurities in forming the second buffer layer 120. Specifically, when appropriately heated, percentages at which phosphorus are activated range from 70 to 100%, whereas percentages at which donors are generated from protons range from approximately 0.5 to 2%. Thus, an amount of implanted phosphorus necessary to secure a certain impurity concentration is much less than that of implanted protons to do so. Thus, using not protons but phosphorus (or other non-proton impurities) as an implanted species for generating donors at a shallow position with respect to the back surface MS1 can reduce a load of the implantation process.

The impurity concentration of the second buffer layer 120 may include a plurality of local maximum values. Thus, oscillations at turn-off can be more effectively suppressed.

The plurality of local maximum values include a first local maximum value at a first position in a thickness direction, and a second local maximum value at a second position in the thickness direction between the first position and the back surface MS1. The second buffer layer 120 may contain, at the first position, protons with an effective concentration higher than that of non-proton impurities, and contain, at the second position, non-proton impurities with an effective concentration higher than that of protons. Thus, a region relatively deep with respect to the back surface MS1 can be doped with protons, whereas a region relatively shallow with respect to the back surface MS1 can be doped with non-proton impurities. This can increase the production efficiency of processes for forming the second buffer layer 120 with the plurality of local maximum values.

Additional Advantages of Modification 2(FIGS. 22 and 23)

Omitting the process of forming the second buffer layer 120 (FIGS. 1 and 2: Embodiment 1) can simplify the method for manufacturing the IGBT.

Embodiment 2

Figure 24:
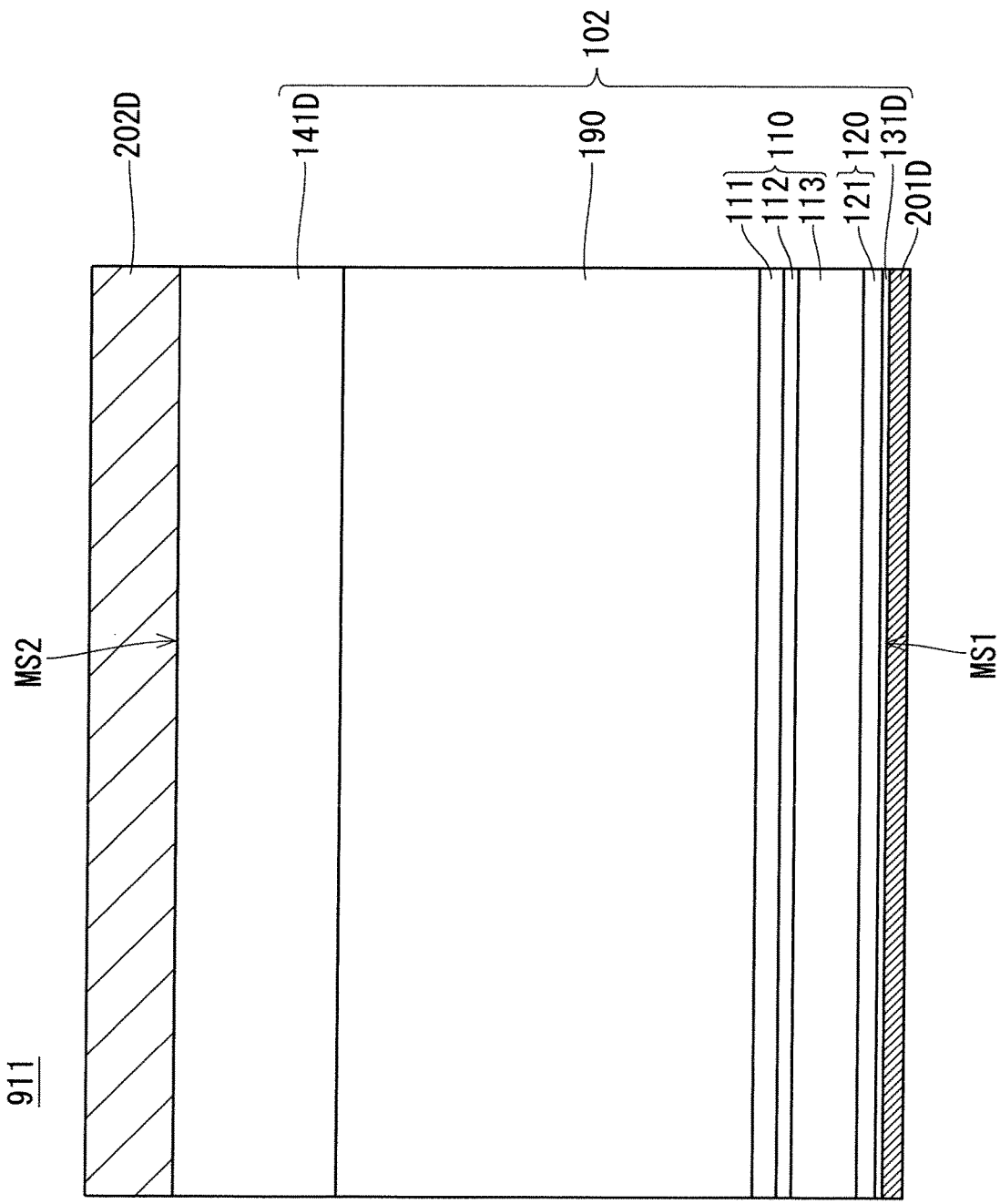
FIG. 24 is a cross-sectional view schematically illustrating a structure of a semiconductor device according to Embodiment 2.

FIG. 24 is a cross-sectional view schematically illustrating a structure of a diode 911 (a semiconductor device) according to Embodiment 2. The diode 911 includes a wafer 102 instead of the wafer 101 (FIG. 1). The wafer 102 includes a cathode layer 131D of n-type, the second buffer layer 120, the first buffer layer 110, the drift layer 190, and an anode layer 141D of p-type in order from the back surface MS1 toward the top surface MS2. The cathode layer 131D is disposed at the back surface MS1 instead of the collector layer 131 (FIG. 1), and has functions of a carrier injection layer. The diode 911 includes, as a first electrode and a second electrode, a cathode electrode layer 201D and an anode electrode layer 202D, instead of the collector electrode layer 201 and the emitter electrode layer 202 (FIG. 1), respectively.

The wafer 102 also includes, similarly to the wafer 101 (FIG. 1), the drift layer 190, the first buffer layer 110, and the second buffer layer 120, which can be formed by the processes described in Embodiment 1. The other structures are similar to those of general diodes. Thus, the description on a method for manufacturing the diode 911 will be omitted.

Modifications of Embodiment 1 may be applied to Embodiment 2. Specifically, the second buffer layer 120 in Embodiment 2 may be modified or omitted similarly to that in Modifications of Embodiment 1.

Replacing a part of the collector layer 131 (e.g., FIG. 1) in Embodiment 1 and Modifications thereof with the cathode layer 131D (FIG. 24) results in formation of both of the collector layer 131 and the cathode layer 131D at the back surface MS1 as carrier injection layers. This can produce a reverse conducting-IGBT (RC-IGBT).

Embodiments can be freely combined, and appropriately modified or omitted.

The following will summarize various aspects of the present disclosure as appendixes.

Appendix 1

A semiconductor device, comprising:
a first electrode layer;
a second electrode layer apart from the first electrode layer in a thickness direction; and
a semiconductor substrate including a first principal surface in contact with the first electrode layer, and a second principal surface in contact with the second electrode layer and opposite to the first principal surface in the thickness direction, the semiconductor substrate including:
a drift layer of n-type; and
a first buffer layer of n-type between the first principal surface and the drift layer,
the first buffer layer including:
a first region containing protons, being higher in impurity concentration than the drift layer, and being in contact with the drift layer;
a second region containing protons, being higher in impurity concentration than the drift layer, being disposed between the first region and the first principal surface, and being in contact with the first region; and
a third region between the second region of the first buffer layer and the first principal surface of the semiconductor substrate,
wherein the first buffer layer has an impurity concentration profile depending on a depth distance from the first principal surface along the thickness direction, and the impurity concentration profile includes:
a maximum value in the second region as a maximum value of the impurity concentration profile of the first buffer layer;
a kink at a boundary point between the first region and the second region, the kink relaxing or stopping a decrease from the maximum value;
a value at the boundary point, the value being higher than or equal to 80% of the maximum value; and
a distribution of the third region, the distribution being longer than or equal to 5 μm and having an impurity concentration lower than the value at the boundary point and lower than or equal to $5.0 \times 10^{14}/cm^3$.

Appendix 2

The semiconductor device according to Appendix 1,
wherein the distribution of the third region in the impurity concentration profile is maintained within 20% of a representative value.

Appendix 3

The semiconductor device according to Appendix 1 or 2,
wherein the semiconductor substrate further includes a second buffer layer of n-type between the first principal surface and the first buffer layer, the second buffer layer being higher in impurity concentration than the third region of the first buffer layer.

Appendix 4

The semiconductor device according to Appendix 3,
wherein the second buffer layer includes a region with at least one non-proton impurity higher in effective concentration than protons.

Appendix 5

The semiconductor device according to Appendix 4,
wherein the at least one non-proton impurity includes phosphorus.

Appendix 6

The semiconductor device according to Appendix 3,
wherein the second buffer layer has an impurity concentration profile including a plurality of local maximum values.

Appendix 7

The semiconductor device according to Appendix 6,
wherein the plurality of local maximum values include a first local maximum value at a first position in the thickness direction, and a second local maximum value at a second position in the thickness direction between the first position and the first principal surface, and the second buffer layer contains, at the first position, protons with an effective concentration higher than an effective concentration of at least one non-proton impurity, and contains, at the second position, at least one non-proton impurity with an effective concentration higher than an effective concentration of protons.

Appendix 8

The semiconductor device according to one of Appendixes 1 to 7,
wherein the first principal surface of the semiconductor substrate has a first concentration of oxygen, and the second principal surface of the semiconductor substrate has a second concentration of oxygen, the first concentration of oxygen being higher than the second concentration of oxygen.

Appendix 9

The semiconductor device according to Appendix 8,
wherein the first concentration of oxygen is higher than or equal to $4.5 \times 10^{17}/cm^3$, and the second concentration of oxygen is lower than or equal to $1.8 \times 10^{17}/cm^3$.

Appendix 10

The semiconductor device according to one of Appendixes 1 to 9,
wherein the value at the boundary point in the impurity concentration profile is lower than or equal to $1 \times 10^{15}/cm^3$.

While the disclosure has been shown and described in detail, the foregoing description is in all aspects illustrative and not restrictive. It is therefore understood that numerous modifications and variations can be devised without departing from the scope of the disclosure.

What is claimed is:
1. A semiconductor device, comprising:
a first electrode layer;
a second electrode layer apart from the first electrode layer in a thickness direction; and
a semiconductor substrate including a first principal surface in contact with the first electrode layer, and a second principal surface in contact with the second electrode layer and opposite to the first principal surface in the thickness direction, the semiconductor substrate including:
a drift layer of n-type; and
a first buffer layer of n-type between the first principal surface and the drift layer, the first buffer layer including:
a first region containing protons, being higher in impurity concentration than the drift layer, and being in contact with the drift layer;
a second region containing protons, being higher in impurity concentration than the drift layer, being disposed between the first region and the first principal surface, and being in contact with the first region; and
a third region between the second region of the first buffer layer and the first principal surface of the semiconductor substrate,
wherein the first buffer layer has an impurity concentration profile depending on a depth distance from the first principal surface along the thickness direction, and
the impurity concentration profile includes:
a maximum value in the second region as a maximum value of the impurity concentration profile of the first buffer layer;
a kink at a boundary point between the first region and the second region, the kink relaxing or stopping a decrease from the maximum value;
a value at the boundary point, the value being higher than or equal to 80% of the maximum value; and
a distribution of the third region, the distribution being longer than or equal to 5 μm and having an impurity concentration lower than the value at the boundary point and lower than or equal to $5.0 \times 10^{14}/cm^3$.

2. The semiconductor device according to claim 1,
wherein the distribution of the third region in the impurity concentration profile is maintained within 20% of a representative value.

3. The semiconductor device according to claim 1,
wherein the semiconductor substrate further includes a second buffer layer of n-type between the first principal surface and the first buffer layer, the second buffer layer being higher in impurity concentration than the third region of the first buffer layer.

4. The semiconductor device according to claim 3,
wherein the second buffer layer includes a region with at least one non-proton impurity higher in effective concentration than protons.

5. The semiconductor device according to claim 4,
wherein the at least one non-proton impurity includes phosphorus.

6. The semiconductor device according to claim 3,
wherein the second buffer layer has an impurity concentration profile including a plurality of local maximum values.

7. The semiconductor device according to claim 6,
wherein the plurality of local maximum values include a first local maximum value at a first position in the thickness direction, and a second local maximum value at a second position in the thickness direction between the first position and the first principal surface, and
the second buffer layer contains, at the first position, protons with an effective concentration higher than an effective concentration of at least one non-proton impurity, and contains, at the second position, at least one non-proton impurity with an effective concentration higher than an effective concentration of protons.

8. The semiconductor device according to claim 1,
wherein the first principal surface of the semiconductor substrate has a first concentration of oxygen, and the second principal surface of the semiconductor substrate has a second concentration of oxygen, the first concentration of oxygen being higher than the second concentration of oxygen.

9. The semiconductor device according to claim 8,
wherein the first concentration of oxygen is higher than or equal to $4.5 \times 10^{17}/cm^3$, and the second concentration of oxygen is lower than or equal to $1.8 \times 10^{17}/cm^3$.

10. The semiconductor device according to claim 1,
wherein the value at the boundary point in the impurity concentration profile is lower than or equal to $1 \times 10^{15}/cm^3$.

* * * * *